(12) United States Patent
Hosono

(10) Patent No.: US 8,625,326 B2
(45) Date of Patent: Jan. 7, 2014

(54) NON-VOLATILE SEMICONDUCTOR MEMORY DEVICE WITH A RESISTANCE ADJUSTING CIRCUIT AND AN OPERATION METHOD THEREOF

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 13/051,703

(22) Filed: Mar. 18, 2011

(65) Prior Publication Data

US 2011/0235398 A1 Sep. 29, 2011

(30) Foreign Application Priority Data

Mar. 24, 2010 (JP) ................................ 2010-068817

(51) Int. Cl.
*G11C 11/00* (2006.01)
(52) U.S. Cl.
USPC ........... 365/148; 365/158; 365/163; 365/171; 365/173
(58) Field of Classification Search
USPC .......................... 365/148, 158, 163, 171, 173
See application file for complete search history.

(56) References Cited

U.S. PATENT DOCUMENTS

| | | | |
|---|---|---|---|
| 7,023,736 B2 | 4/2006 | Cernea et al. | |
| 7,486,562 B2 | 2/2009 | Ogawa et al. | |
| 7,889,545 B2 | 2/2011 | Lee et al. | |
| 2004/0095805 A1 | 5/2004 | Matsuoka | |
| 2006/0034140 A1 | 2/2006 | Ogawa et al. | |
| 2007/0242528 A1 * | 10/2007 | Inoue | 365/189.01 |
| 2008/0025088 A1 * | 1/2008 | Scheuerlein et al. | 365/185.03 |
| 2009/0268509 A1 | 10/2009 | Maejima | |
| 2011/0066878 A1 | 3/2011 | Hosono et al. | |

FOREIGN PATENT DOCUMENTS

| | | |
|---|---|---|
| JP | 2004-158119 A | 6/2004 |
| JP | 2006-79803 A | 3/2006 |
| JP | 2009-48757 | 3/2009 |
| JP | 2009-266304 A | 11/2009 |

OTHER PUBLICATIONS

Japanese Office Action issued Jun. 19, 2012 in Patent Application No. 2010-068817 with English Translation.

* cited by examiner

*Primary Examiner* — Thao Bui
(74) *Attorney, Agent, or Firm* — Oblon, Spivak, McClelland, Maier & Neustadt, L.L.P.

(57) ABSTRACT

A semiconductor memory device in accordance with an embodiment includes a memory cell array having memory cells disposed at an intersection of first lines and second lines; and a control circuit configured to execute a read operation, thereby determining a resistance state of the selected one of the memory cells. The read operation is an operation configured to execute a sensing operation multiple times and aggregate determination results thereof. The sensing operation is configured such that a first voltage is applied to selected ones of the first lines and a second voltage lower than the first voltage is applied to a single selected one of the second lines. The control circuit suspends application of the first voltage to the first line connected to the selected one of the memory cells determined to be in a first resistance state in one of the sensing operations, and executes the next sensing operation.

18 Claims, 18 Drawing Sheets

Simultaneous Read
of Multiple Cells
(Voltage dV1)

Simultaneous Read
of Multiple Cells
(Voltage dV1)

NON-VOLATILE SEMICONDUCTOR MEMORY DEVICE WITH A RESISTANCE ADJUSTING CIRCUIT AND AN OPERATION METHOD THEREOF

CROSS REFERENCE TO RELATED APPLICATION

This application is based upon and claims the benefit of priority from prior Japanese Patent Application No. 2010-68817, filed on Mar. 24, 2010, the entire contents of which are incorporated herein by reference.

BACKGROUND

1. Field

The embodiments described herein relate to a semiconductor memory device and an operation method thereof.

2. Description of the Related Art

In recent years, resistive memory devices utilizing a variable resistor as a memory element are receiving attention as candidates to succeed flash memory. The resistive memory devices herein are assumed to include not only resistive RAM (ReRAM), in a narrow sense, that uses a transition metal oxide as a recording layer and stores its resistance states in a non-volatile manner, but also the likes of Phase Change RAM (PCRAM) that uses chalcogenide or the like as a recording layer to utilize the resistance information of crystalline states (conductors) and amorphous states (insulators).

Two kinds of operation modes in memory cells of resistive memory devices are known. In one kind, known as a bipolar type, a high-resistance state and a low-resistance state are set by switching a polarity of an applied voltage. In the other kind, known as a unipolar type, setting of the high-resistance state and the low-resistance state are made possible by controlling a voltage value and a voltage application time, without switching the polarity of the applied voltage.

The unipolar type is preferable for realizing a high-density memory cell array. This is because, in the case of the unipolar type, the cell array can be configured by overlapping a variable resistor and a rectifier such as a diode at intersections of bit lines and word lines, without using a transistor. Furthermore, arranging such memory cell arrays three-dimensionally in stacks enables a large capacity to be realized without causing an increase in cell array area.

In the case of unipolar type ReRAM, write of data to a memory cell is performed by applying a certain voltage to the variable resistor for a short time. This causes the variable resistor to change from the high-resistance state to the low-resistance state. This operation to change the variable resistor from the high-resistance state to the low-resistance state is hereinafter referred to as a setting operation. On the other hand, erase of data in the memory cell is performed by applying a certain voltage to the variable resistor for a long time, the certain voltage being lower than that applied during the setting operation, and the variable resistor being in the low-resistance state subsequent to the setting operation. This causes the variable resistor to change from the low-resistance state to the high-resistance state. This operation to change the variable resistor from the low-resistance state to the high-resistance state is hereinafter referred to as a resetting operation. The memory cell adopts, for example, the high-resistance state as a stable state (reset state), and, in the case of binary data storage, write of data is performed by the setting operation in which the reset state is changed to the low-resistance state.

A read operation of the memory cell is performed by applying a certain voltage to the variable resistor and using a differential amplifier to monitor a current flowing through the variable resistor. This read operation allows determination of whether the variable resistor is in the low-resistance state or the high-resistance state. It is required in this kind of semiconductor memory device that the read operation causes data to be read reliably from a selected memory cell, even if there are dispersions in characteristics of the variable resistors.

DETAILED DESCRIPTION

A semiconductor memory device in accordance with an embodiment comprises: a memory cell array having memory cells disposed at intersections of a plurality of first lines and a plurality of second lines respectively, each of the memory cells including a variable resistor; and a control circuit configured to execute a read operation by applying a certain voltage to selected one of the memory cells disposed at the intersection of selected one of the first lines and selected one of the second lines and detecting a current flowing in the selected one of the first lines, thereby determining a resistance state of the variable resistor in the selected one of the memory cells. The read operation is an operation configured to execute a sensing operation multiple times and aggregate determination results thereof, the sensing operation being configured such that a first voltage is applied to a plurality of selected ones of the first lines and a second voltage lower than the first voltage is applied to a single selected one of the second lines. The control circuit is configured to suspend application of the first voltage to the first line connected to the selected one of the memory cells determined to be in a first resistance state in one of the sensing operations, and execute the next sensing operation.

Embodiments of the present invention are now described with reference to the accompanying drawings. A semiconductor memory device described in the present embodiments is a resistive memory device employing a variable resistor as memory element. However, it goes without saying that this configuration is no more than an example, and that the present invention is not limited to this configuration.

First Embodiment

Figure 1:
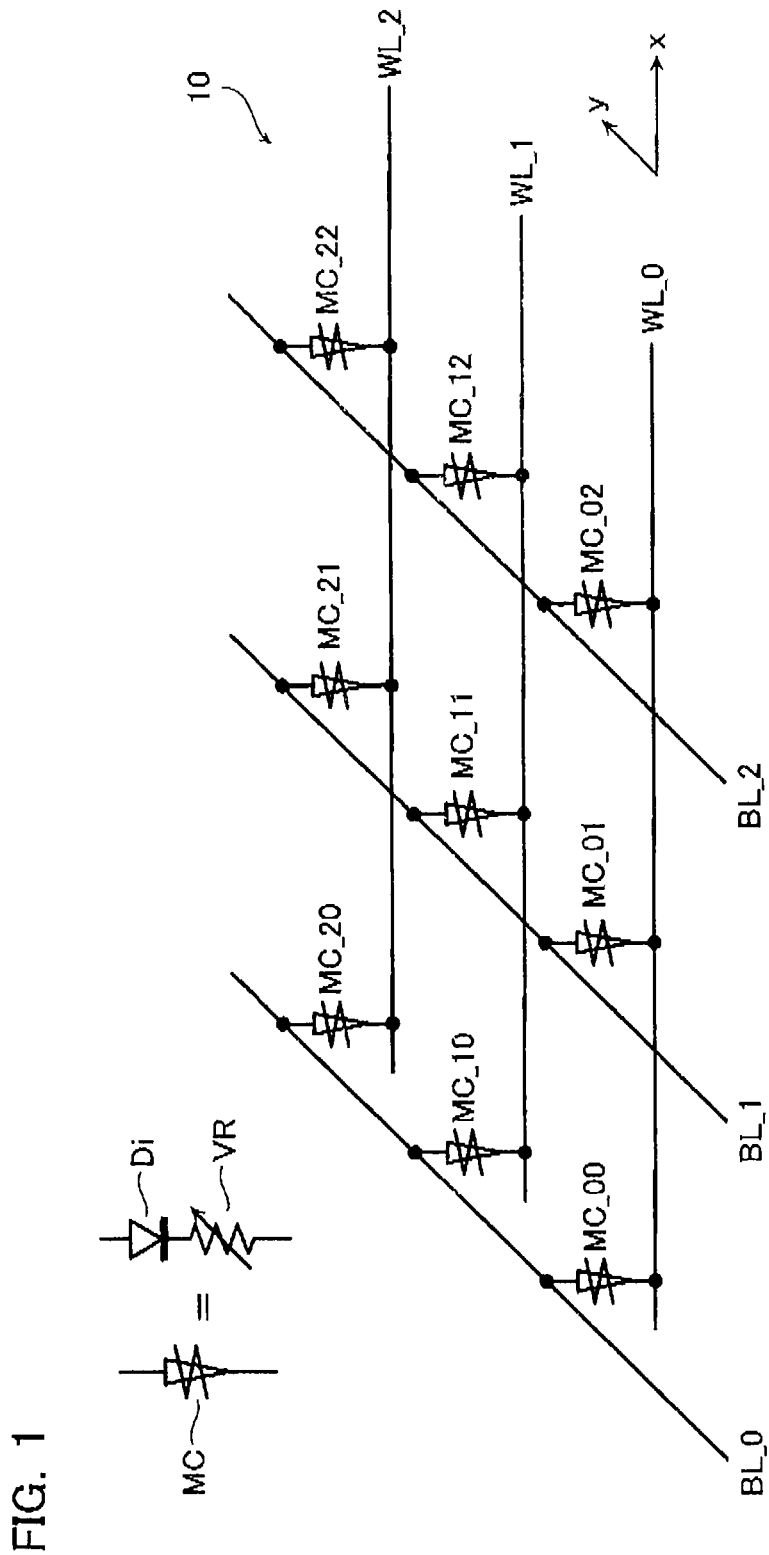
FIG. 1 is a view showing a memory cell array in a semiconductor memory device in an embodiment of the present invention.

Configuration of Semiconductor Memory Device in Accordance with First Embodiment FIG. 1 is a view showing part of a memory cell array 10 in a semiconductor memory device in accordance with a first embodiment of the present invention. As shown in FIG. 1, a resistive memory device of a unipolar type has resistive-type unit memory cells MC disposed at respective intersections of mutually-intersecting bit lines BL and word lines WL. The resistive-type unit memory cell MC has a rectifier, for example, a diode Di, and a variable resistor VR connected in series. Here, the bit lines BL are assumed to be signal lines connected to an anode side of the diode Di and the word lines WL are assumed to be signal lines connected to a cathode side of the diode Di. Moreover, the memory cells MC configured by the diode Di and the variable resistor VR connected in series are expressed using symbols shown in the figure. This applies similarly to the example below. Here, a disposition and polarity of the diode Di and variable resistor VR configuring the memory cell MC are likewise not limited to what is shown in the figure. The memory cell array 10 shown in FIG. 1 has, for example, 4 k memory cells MC disposed in a longitudinal direction of the bit line BL (y direction shown in FIG. 1) and 1 k memory cells MC disposed in a longitudinal direction of the word line WL (x direction shown in FIG. 1), the memory cells MC being arranged in a two-dimensional matrix.

The variable resistor VR is, for example, one having a structure comprising electrode/transition metal oxide/electrode or the like. The variable resistor VR varies a resistance of the metal oxide based of applied conditions of voltage, current, heat and so on, and stores those differing states of resistance as information in a nonvolatile manner. Utilizable as the variable resistor VR are, more specifically, for example, ones like chalcogenide or the like in which the resistance is varied due to phase transition between a crystalline state and an amorphous state (PCRAM), ones in which the resistance is varied by precipitating metal cations to form a contacting bridge between the electrodes and ionizing the precipitated metal to destroy the contacting bridge (CBRAM: Conductive Bridging RAM), and ones in which the resistance is varied by voltage or current application (broadly divided into ones in which a resistance variation occurs due to presence/absence of a trapped charge in a charge trap existing in an electrode interface and ones in which a resistance variation occurs due to presence/absence of a conductive path induced by oxygen deficiency or the like) (ReRAM).

In the case of unipolar type ReRAM, write of data to the memory cell MC is performed by applying to the variable resistor VR a voltage of, for example, 3.5 V (actually about 4.5 V if a voltage drop portion of the diode Di is included) and a current of about 10 nA for a time of about 10 ns-100 ns. This causes the variable resistor VR to change from the high-resistance state to the low-resistance state (setting operation).

On the other hand, erase of data in the memory cell MC is performed by applying to the variable resistor VR in the low-resistance state subsequent to the setting operation a voltage of 0.8 V (actually about 1.8 V if a voltage drop portion of the diode Di is included) and a current of about 1 µA-10 µA for a time of about 500 ns-2 µs. This causes the variable resistor VR to change from the low-resistance state to the high-resistance state (resetting operation).

A read operation of the memory cell MC is performed by applying to the variable resistor VR a voltage of 0.4 V (actually about 1.4 V if a voltage drop portion of the diode Di is included) and monitoring a current flowing through the variable resistor VR using a sense amplifier. This allows it to be determined whether the variable resistor VR is in the low-resistance state or the high-resistance state. This read operation is described in detail in the embodiments hereinafter.

Figure 2:
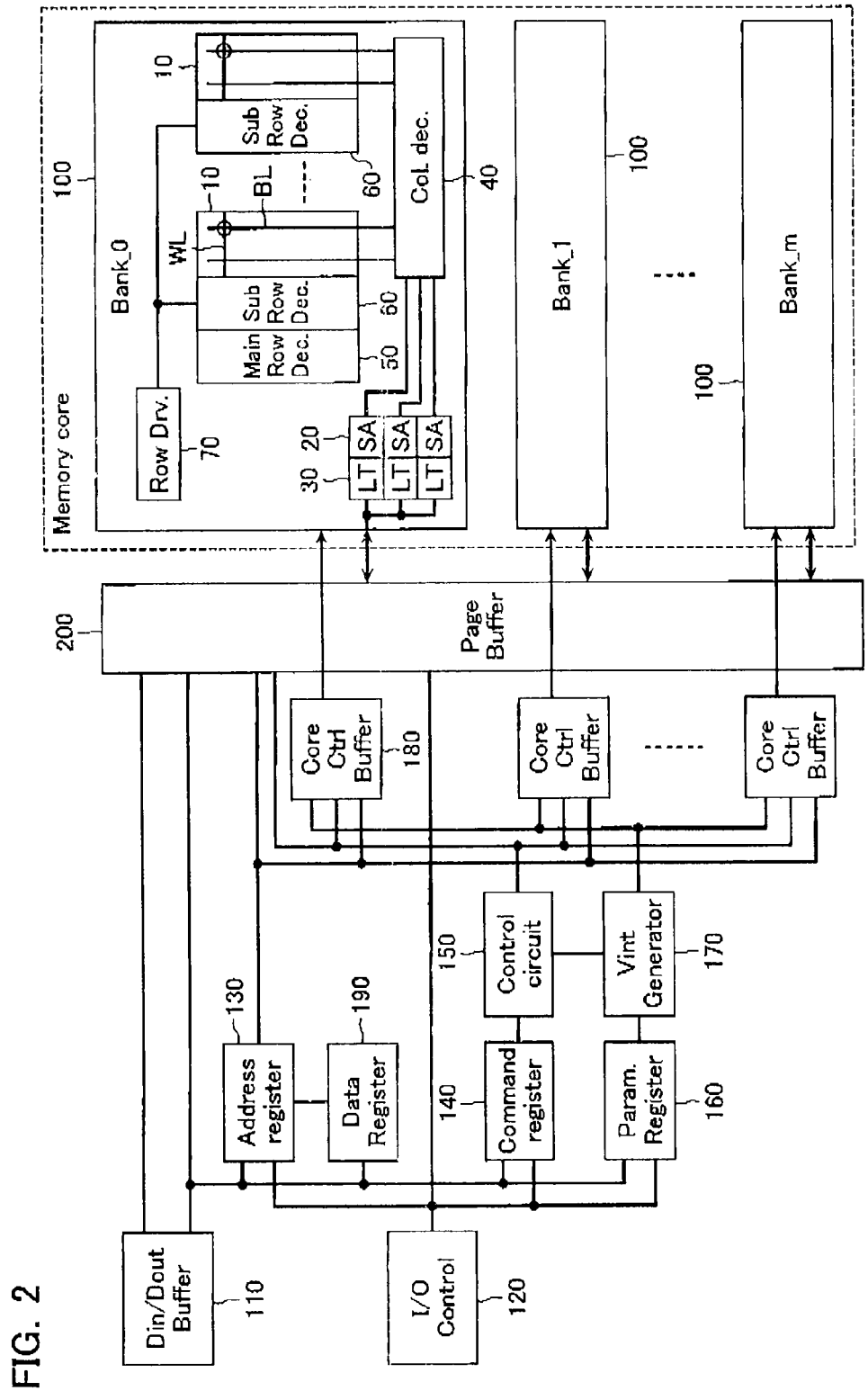
FIG. 2 is a block diagram showing a control circuit in a semiconductor memory device in the embodiment of the present invention.

FIG. 2 is a block diagram showing a control circuit in the semiconductor memory device of the present embodiment. The control circuit includes a sense amplifier 20, a latch 30, a column decoder 40, a main row decoder 50, a sub row decoder 60, and a word line drive circuit 70. In the configuration of the control circuit shown in FIG. 2, the column decoder 40, the main row decoder 50, and the word line drive circuit 70 are shared by a plurality of memory cell arrays 10.

Bit lines BL are connected to the sense amplifier and the latch 30 via the column decoder 40. A plurality of sense amplifiers 20 respectively detect read-out data, and a plurality of latches 30 temporarily retain the read-out data and write data. The sense amplifiers 20 and latches 30 are also shared by the plurality of memory cell arrays 10. The column decoder 40 comprises a plurality of column circuit units each including a decoder circuit and a bit line switch circuit, the decoder circuit being configured to simultaneously select, for example, 16 bit lines BL. The description below proceeds assuming the number of sense amplifiers 20 to be 16 corresponding to the number of bit lines BL simultaneously selected by the column decoder 40.

The latches 30 are connected to the page buffer 200, and temporarily retain read data and write data sent and received between the sense amplifiers 20 and the page buffer 200 during a read operation and a write operation. The page buffer 200 is a data register configured to temporarily retain one page of data (for example, 2 k bytes) which is the unit of data processing. If the page buffer 200 is configured to retain multiple pages of data, it can be operated as a cache memory.

Word lines WL are connected to the main row decoder 50 and sub row decoder 60. The main row decoder 50 and sub row decoder 60 allow one word line WL to be selected. Here, the row decoder is assumed to have a hierarchical structure of a main row decoder 50 shared by a plurality of memory cell arrays 10, and a sub row decoder 60 attached to each of the memory cell arrays 10. Word line selection is performed by this hierarchically structured row decoder. A selected word line WL and an unselected word line WL are applied with, respectively, a certain selected word line voltage and a certain unselected word line voltage, from the word line drive circuit 70.

Here, an assembly of the control circuits such as the column decoder 40, sense amplifiers 20, main row decoder 50, sub row decoders 60, and a certain number of the memory cell arrays 10 that share these control circuits is termed a bank 100. The semiconductor memory device comprises a plurality of banks 100 (Bank_0-Bank_m). A region where this plurality of banks 100 (Bank_0-Bank_m) is aligned is termed a memory core unit. Disposed in a periphery of the memory core unit are various peripheral circuits configured to perform operation control of the memory core unit.

The peripheral circuits include a data input/output buffer 110, an input/output control circuit 120, an address register 130, a command register 140, an operation control circuit 150, a parameter register 160, an internal voltage generating circuit 170, a core control buffer 180, a data register 190, and the page buffer 200.

The data input/output buffer 110 is connected to an I/O pad and performs input/output of data to this semiconductor memory device. The circuit configuration of FIG. 2 shows a multiplex system in which commands, addresses, and data used in operation of the semiconductor memory device are all provided by the I/O pad. For example, when writing data, a data write command, an address indicating a location of a selected memory cell MC, and write data are provided to the semiconductor memory device via the data input/output buffer 110. Moreover, when reading data, a data read command and selection address are likewise provided to the semiconductor memory device. Read data read-out from the memory core unit based on these command and address is stored in the page buffer 200; subsequently, the data is outputted to external via the data input/output buffer 110.

The input/output control circuit 120 controls identification of data and so on inputted/outputted from the I/O pad and controls data output. Provided from external to the input/output control circuit 120 are various control signals such as write enable signal, read enable signal, command latch enable signal, address latch enable signal, and so on. The input/output control circuit 120 controls input/output data based on combination of states of these signals and based on the timings thereof.

The input/output control circuit 120 recognizes, when command is provided thereto, data inputted from the data input/output buffer 110 as a command, and stores the data in the command register 140. Similarly, the input/output control circuit 120 recognizes, when address is provided thereto, data inputted from the data input/output buffer 110 as an address, and stores the data in the address register 130. The input/output control circuit 120 stores, when data is provided thereto, data inputted from the data input/output buffer 110 in the page buffer 200. Conversely, during data output, input/output control circuit 120 allows the page buffer 200 to be capable of output data. When write data and control parameters are inputted, these are stored in, respectively, the data register 190 and the parameter register 160. Although not shown in FIG. 2, the input/output control circuit 120 may be configured to administer output control of status indicating operation state of the semiconductor memory device, ID code output, and so on.

During the read operation, a command is inputted whereby an internal control clock is activated and the operation control circuit 150 starts the operation. Additionally activated is the internal voltage generating circuit 170 configured to generate an internal voltage appropriate to various operations. During the read operation, the operation control circuit 150 outputs a timing signal to the core control buffer 180 to perform a desired read operation in the memory core unit. The timing signal controls charging/discharging of the word lines WL and bit lines BL, precharge of the sense amplifiers 20, and a sensing operation. In addition, the internal voltage generating circuit 170 supplies a certain voltage to the memory core unit and the core control buffer 180.

The core control buffer 180 herein is provided to each of the banks Bank_0-Bank_m. Hence, simultaneously operated banks can be freely or independently controlled. For example, when raising data processing speed of the read operation and write operation, it is only required to increase the number of simultaneously activated banks. Current consumption may be very large according to the operation. Accordingly, the number of simultaneously activated banks may be increased or decreased appropriately.

Operation of Semiconductor Memory Device in Accordance with First Embodiment

Next, the read operation in the semiconductor memory device configured as above is described. In the read operation in the semiconductor memory device in the present embodiment, data is read simultaneously from a plurality of the memory cells MC in the memory cell array 10.

When reading data simultaneously from a plurality of selected memory cells MC, a plurality of selected bit lines BL (for example, 16) in the memory cell array 10 are applied with a selected bit line voltage VUX. On the other hand, a single selected word line WL is applied with a selected word line voltage Vss_row. Other unselected bit lines BL and unselected word lines WL are applied with, respectively, an unselected bit line voltage VUB and an unselected word line voltage VUX.

In this embodiment, it is assumed that a value of the voltage VUX is set to a certain voltage such that a voltage dV1 is applied, along the forward bias direction of the diode Di, between both ends of the plurality of memory cells MC that are connected at intersections of the plurality of selected bit lines BL and the single selected word line WL, and are in a selected state. As an example, the voltage dV1 herein may be set to a voltage necessary for correctly reading a memory cell MC when a read method of reading a memory cell MC one by one by selecting a single bit line BL and single word line WL (a bit-by-bit read method) is executed.

An amount of a cell current Icell changes according to whether the variable resistor VR in the selected memory cell MC is in the low-resistance state (first resistance state) or the high-resistance state (second resistance state). If a cell current Icell flowing in the memory cell MC is equal to or more than a determining current I_read, the variable resistor VR is determined to be in the low-resistance state, and data "0" is read out. Alternatively, if the cell current Icell flowing in the memory cell MC is below the determining current I_read, the variable resistor VR is determined to be in the high-resistance state, and data "1" is read out.

In the read operation in the semiconductor memory device in the present embodiment, the sensing operation is repeated two or more times to determine data retained in the memory cells MC. A sensing operation herein refers to the above-described operation configured to apply the voltage VUX to the plurality of selected bit lines BL and the voltage Vss_row to the single selected word line WL and thereby read data from the plurality of selected memory cells MC.

In the semiconductor memory device in the present embodiment, memory cells MC determined to be in the low-resistance state of "0" data in any one of the sensing operations are excluded from subjects of the sensing operation in the next sensing operation. Specifically, when a certain memory cell MC is determined to be in the low-resistance state, in any one of the sensing operation, a bit line BL connected to such the memory cell MC is discharged, and the memory cell MC is not subject to the next sensing operation.

Figure 3:
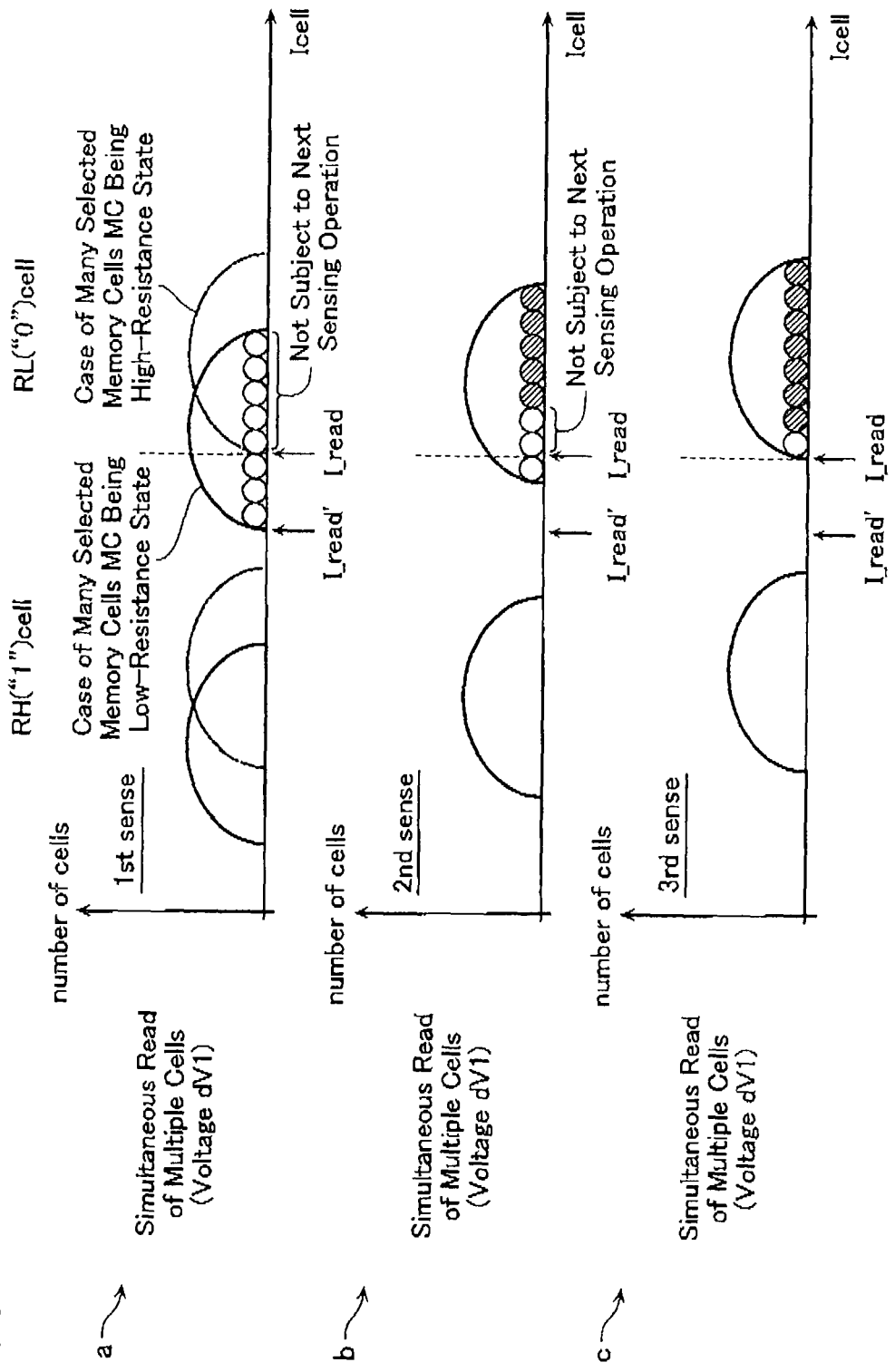
FIG. 3 is a view explaining a read operation in the semiconductor memory device in a first embodiment.

This read operation is described in detail below with reference to FIG. 3. FIG. 3 is a view explaining the read operation in the semiconductor memory device in the present embodiment.

FIG. 3 shows a frequency distribution of cell current Icell when the value of the voltage VUX is set such that the memory cells MC are applied with the voltage dV1. In FIG. 3, the horizontal axis shows the cell current Icell, and the vertical axis shows the number of memory cells MC. Shown at symbols "a"-"c" are the distribution of memory cells MC in, respectively, the first, second, and third sensing operations. Each time the sensing operation is performed, a memory cell MC in which a cell current Icell equal to or larger than the determining current I_read flows is read as being in the low-resistance state ("0" data: distribution RL ("0") cell). Alternatively, a memory cell MC in which a cell current Icell lower than the determining current I_read flows is read as being in the high-resistance state ("1" data: distribution RH ("1") cell). In the explanation of the embodiments, this determining current I_read corresponds to a boundary current value at which the sense amplifiers 20 determine L/H of the memory cells MC. Moreover, the determining current I_read is described as coinciding with the lower limit of the distribution of the low-resistance state cells. This determining current I_read is thus easily understood by imagining a setting verify read subsequent to a setting pulse application. In an actual ordinary read operation, a certain margin is required with respect to the data distributions, hence a determining current I_read' shown in the figure is set as the determining current. However, a read operation in a state where that margin is lost for some reason, has the relationship of the determining current I_read and the distribution shown in the figure. In the description below, a read operation employing a determining current I_read in the sense amplifiers is described, without making any special distinction between the setting verify read operation and the ordinary read operation.

Symbol "a" in FIG. 3 is a distribution showing a state of the first sensing operation, which is the first of the multiply-repeated sensing operations.

In the first sensing operation, if it is assumed that many of the selected memory cells MC are in the low-resistance state, a cell current Icell_on (Icell_on is assumed here to be an average cell current flowing in the low-resistance state memory cells when reading using the bit-by-bit method) flows from each of those many low-resistance state memory cells MC into the selected word line WL. If there are n selected memory cells MC in the low-resistance state, the current flowing into the selected word line WL is n×Icell_on. As a result, the voltage of the selected word line WL rises higher than the voltage Vss_row, and the voltage applied to the selected memory cell MC becomes smaller than the above-described value dV1. As a result, it becomes difficult for the cell current to flow, which therefore leads to decrease of the cell current Icell_on, i.e., the average current of the low-resistance state memory cells MC. In practice, there is dispersion in the cell current in the low-resistance state memory cells MC. Accordingly, a cell current in some memory cells MC which is supposed to be set to the low-resistance state may fall below the determining current I_read. That is, the lower limit of distribution of the memory cells MC in the low-resistance state becomes a value of the determining current I_read or less (refer to distribution shown by a solid line in symbol "a" of FIG. 3).

On the other hand, in the first sensing operation, if many of the selected memory cells MC are assumed to be in the high-resistance state and have a resistance value one digit or more higher than in the low-resistance state case, the influence on the voltage of the selected word line WL is small, even if current flows into the selected word line WL. In that case, the voltage applied to the selected memory cells MC hardly changes from dV1, and the low-resistance state memory cells MC can allow flow of a cell current, which is the determining current I_read or more, in a state similar to the state of the bit-by-bit method. The distribution of the low-resistance state memory cells MC in this case, including the lower limit of the distribution, may be imagined to lie on or above the determining current I_read (refer to distribution shown by a dashed-dotted line in symbol "a" of FIG. 3).

In the first sensing operation, memory cells MC having a cell current not less than the determining current I_read are determined by the sense amplifiers. Memory cells MC determined to be in the low-resistance state in the first sensing operation are excluded from the memory cells MC subject to the sensing operation in the next sensing operation. When many of the selected memory cells MC are in the low-resistance state (distribution shown by a solid line in symbol "a" of FIG. 3), several of the memory cells MC on a lower limit side of the distribution of low-resistance state memory cells MC may be provisionally determined to be in the high-resistance state. However, memory cells MC, in which a cell current not less than the determining current I_read flows, are accurately determined to be in the low-resistance state and excluded from the memory cells MC subject to the sensing operation in the next sensing operation. Specifically, the selected bit lines BL connected to the memory cells MC determined to be in the low-resistance state in the first sensing operation are discharged, and the sensing operation is not performed on those memory cells MC in the second sensing operation.

Note that when many of the selected memory cells MC are in the high-resistance state and the current flowing into the word line WL is small, it is conceivable that all of the memory cells MC in the low-resistance state are read normally.

Symbol "b" in FIG. 3 is a distribution showing a state of the second sensing operation, which is the second of the multiply-repeated sensing operations. The value of the voltage VUX is set such that the voltage applied to the selected memory cells MC is also dV1 in the second sensing operation. Memory cells MC determined to be in the low-resistance state in the first sensing operation have their corresponding bit lines BL discharged and are not applied with a voltage in the second sensing operation (shown by the shaded circular symbols in FIG. 3). That is, in the second sensing operation, only memory cells MC provisionally determined to be in the high-resistance state but actually in the low-resistance state and memory cells MC actually in the high-resistance state are subject to the sensing operation. As a result of memory cells MC determined to be in the low-resistance state in the first sensing operation being excluded from the memory cells MC subject to the sensing operation, the number of low-resistance state memory cells MC to be simultaneously subjected to the sensing operation is reduced. As a result, the current flowing into the selected word line WL via the memory cells MC is reduced. In that case, the rise in potential of the selected word line WL is suppressed compared to the first sensing operation, and the voltage applied to the remaining selected memory cells MC subject to the second sensing operation increases to approach the applied voltage as it should normally be. Consequently, of the low-resistance state memory cells MC provisionally determined to be in the high-resistance state in the first sensing operation, several are accurately determined to be in the low-resistance state in the second sensing operation. Memory cells MC determined to be in the low-resistance state in the second sensing operation are excluded from the memory cells MC subject to the sensing operation in the third sensing operation.

Symbol "c" in FIG. 3 is a distribution showing a state of the third sensing operation, which is the third of the multiply-repeated sensing operations. The value of the voltage VUX is set such that the voltage applied to the selected memory cells MC is also dV1 in the third sensing operation. Memory cells MC determined to be in the low-resistance state in the first and second sensing operations have their corresponding bit lines BL discharged and are not applied with a voltage in the third sensing operation (shown by the shaded circular symbols in FIG. 3). As a result, the current flowing into the selected word line WL via the memory cells MC is further reduced. The rise in potential of the selected word line WL is suppressed compared to the second sensing operation, and the voltage applied to the remaining selected memory cells MC subject to the third sensing operation increases. Consequently, the low-resistance state memory cells MC provisionally determined to be in the high-resistance state in the second sensing operation are reliably determined to be in the low-resistance state in the third sensing operation.

In this way, the semiconductor memory device in the present embodiment repeats the sensing operation multiple times to determine data retained in the memory cells MC. Memory cells MC determined to be in the low-resistance state each time the sensing operation is performed are excluded from the memory cells MC subject to the sensing operation in the next sensing operation. As the sensing operation is repeated in this way, the number of the selected memory cells MC decreases, hence the current flowing into the selected word line WL decreases. As a result, the rise in potential of the selected word line WL from the voltage Vss_row due to the current flowing into the selected word line WL also becomes smaller. Those of the plurality of low-resistance state memory cells MC having a comparatively high resistance value (small cell current) have their cell current further reduced by the rise in potential of the selected word line WL and, as a result, may be provisionally determined to be in the high-resistance state in the first sensing operation. However, in the second and later sensing operations, when the number of memory cells MC subject to the sensing operation is reduced, the rise in potential of the selected word line WL is also reduced. This leads to the memory cells MC being applied with a desired read voltage, whereby it may be accurately determined that the memory cells MC are in the low-resistance state. Determination results of the repeated sensing operations are aggregated in a temporary data retaining devices such as the latch circuits 30 provided to each of the sense amplifiers 20, whereby control of bit lines BL for which a certain determining operation is completed can be individually performed. Moreover, subsequent to the last of a certain number of sensing operations being completed, a final read result is stored in the data retaining devices.

Figure 4:
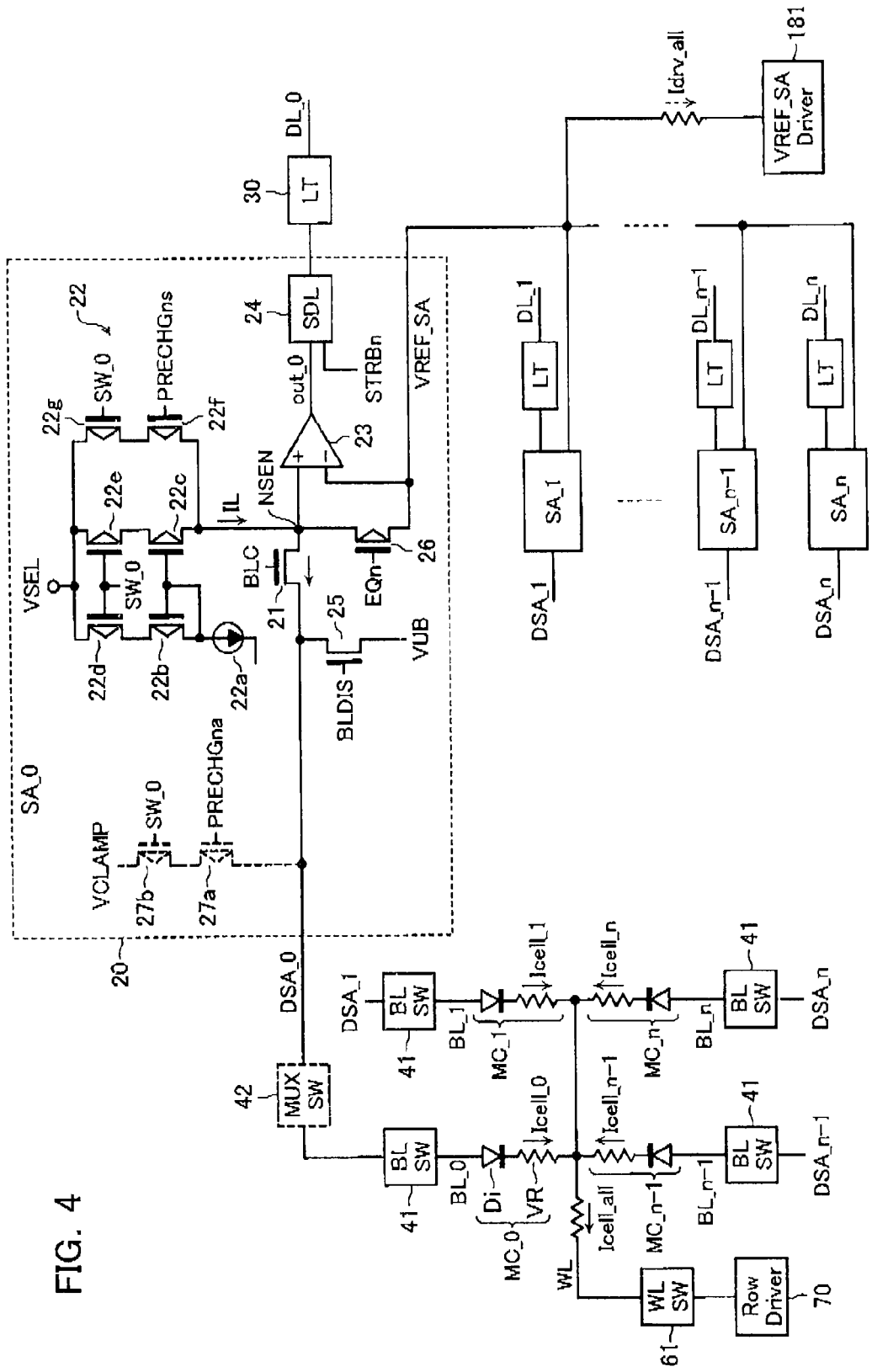
FIG. 4 is a circuit diagram explaining the control circuit in the semiconductor memory device in the first embodiment.
Figure 5:
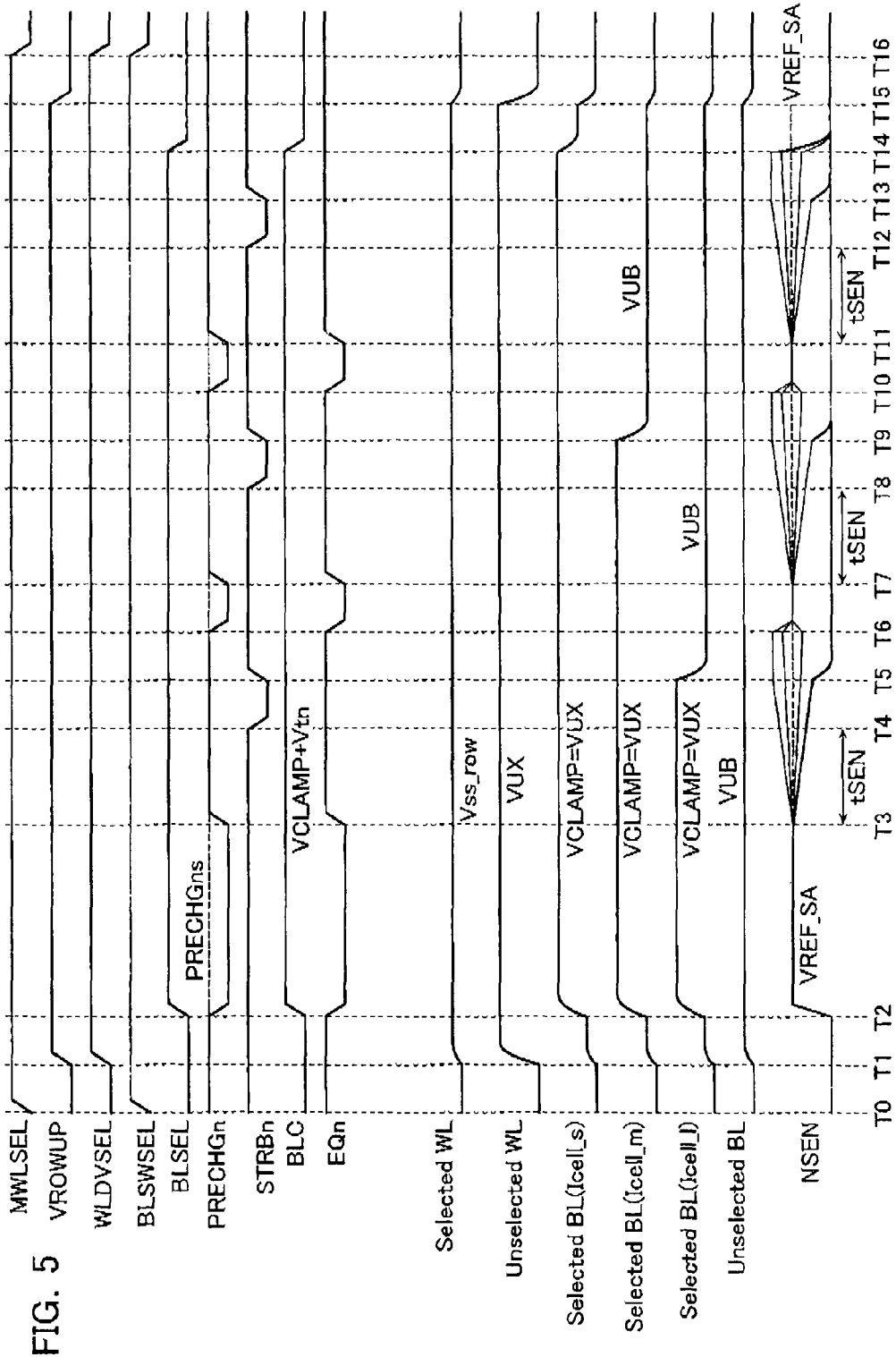
FIG. 5 is a timing chart explaining the read operation in the semiconductor memory device in the first embodiment.

Next, details of the control circuit configured to enable such an above-described operation, and timing of the operation are described with reference to FIGS. 4 and 5. FIG. 4 is a circuit diagram explaining the control circuit in the semiconductor memory device in the embodiment, and FIG. 5 is a timing chart explaining the read operation.

As shown in FIG. 4, the memory cell array 10 is configured by memory cells MC_0-MC_n as basic units, the memory cells MC_0-MC_n each having a variable resistor VR and a diode Di connected in series. Bit lines BL_0-BL_n are connected to an anode side of the diode Di. In addition, a word line WL is connected to an end of the variable resistor VR. A word line switch 61 is, specifically, a word line drive transistor connected directly to the word line WL. This word line switch 61 is included in the sub row decoder 60. The word line drive circuit 70 is a circuit configured to perform voltage control of a word line voltage.

The bit lines BL_0-BL_n are connected to signal lines DSA_0-DSA_n via bit line switches 41 included in the column decoder 40. These signal lines DSA_0-DSA_n are connected to the sense amplifiers 20. As shown in FIG. 4, multiplexers 42 may also be provided between the column decoder 40 and the sense amplifiers 20. The multiplexer 42 may be introduced, if desired, according to the circuit configuration. For example, when the number of bit lines BL simultaneously selected by the column decoder 40 is greater than the number of sense amplifiers 20, the need arises to select a bit line group to be connected to the sense amplifiers 20. The multiplexer 42 is required in such a case.

The sense amplifier 20 comprises a clamp transistor 21, a current mirror circuit 22, a differential amplifier 23, a sense data latch 24, a discharge transistor 25, and an equalize transistor 26. The clamp transistor 21 has its one end connected to the signal line DSA, and its other end connected to a non-inverting input terminal of the differential amplifier 23 (sense node NSEN). A reference voltage VREF_SA for data determination is supplied to an inverting input terminal of the differential amplifier 23. The equalize transistor 26 is connected between the sense node NSEN and the inverting input terminal of the differential amplifier 23. The equalize transistor 26, which is turned on when a signal EQn is "L" state, sets the voltage of the sense node NSEN equal to the reference voltage VREF_SA. A reference voltage drive circuit 181 configured to output the reference voltage VREF_SA is included in the core control buffer 180 shown in FIG. 2, for example.

The discharge transistor 25 is connected between the signal line DSA and a VUB terminal (terminal applied with between 0 V and a diode forward bias direction voltage Vf (up to about 0.6 V)). The discharge transistor 25 has its gate inputted with a bit line discharge signal BLDIS and thereby functions to discharge the signal line DSA to a potential VUB of the VUB terminal (or aground potential), PMOS transistors 27a and 27b shown by the broken lines in FIG. 4 may also be added to assist bit line precharge. The transistors 27a and 27b charge the bit lines BL to a voltage VCLAMP when signals PRECHGna and SW_0 are "L" state.

In addition, the current mirror circuit 22 is connected to the sense node NSEN, the current mirror circuit 22 being configured from a current supply circuit 22a and PMOS transistors 22b, 22c, 22d, and 22e. Moreover, a power supply VSEL is also a part of the current mirror circuit 22. The PMOS transistors 22b, 22c, 22d, and 22e configure a current mirror having a switch control function. The current mirror has the power supply VSEL connected thereto, and is applied with a certain voltage from the power supply VSEL, the certain voltage being necessarily-and-sufficiently higher than a setting level of the bit line BL. In addition, current is supplied to the current mirror circuit 22 by the current supply circuit 22a. When the signal SW_0 and a signal PRECHGns are in "L" state, the current mirror circuit 22 passes a certain current to the sense node NSEN. During the read operation, the current mirror circuit 22 passes a read-dedicated reference current IL to the sense node NSEN.

A basic operation of the sense amplifier 20 is as follows. That is, while the voltage of the bit line BL is clamped by the clamp transistor 21, a cell current Icell_0 is passed through the selected memory cell MC. The reference current IL is passed from the current mirror circuit 22 into the sense node NSEN. The change in voltage of the sense node NSEN due to the difference between these current cell Icell_0 and reference voltage IL is determined by the differential amplifier 23.

An output signal out_0 of the differential amplifier 23 is loaded into the sense data latch 24. The sense data latch 24 latches the output signal out_0 of the differential amplifier 23 based on a signal STRBn. When the read operation is completed, data retained by this sense data latch 24 is sent to the latch 30 as an output signal of the sense amplifier 20. Data in the latch 30 is then outputted to external via the page buffer 200.

The memory cells MC_1-MC_n simultaneously selected to undergo execution of the read operation are also connected, via the respective signal lines DSA_1-DSA_n, to corresponding sense amplifiers 20 configured similarly to the sense amplifier 20 described above.

Next, the read operation employing the control circuit in the semiconductor memory device in the present embodiment is described with reference to FIG. 5. The timing chart of FIG. 5 shows states of typical control signals, and voltage values of the word lines WL, bit lines BL, and the sense node NSEN of the sense amplifier 20.

First, at time T0, a signal MWLSEL and a signal BLSWSEL become "B" state, whereby the main row decoder 50 and the column decoder 40 are enabled.

Next, at time T1, a signal VROWUP and a signal WLD-VSEL become "H" state, whereby the sub row decoder 60 is enabled. The selected word line WL is applied with the voltage Vss_row, and the unselected word lines WL are applied with the voltage VUX. Additionally, at time T1, the bit lines BL are applied with the unselected bit line voltage VUB.

At time T2, a signal BLSEL becomes "H" state, whereby a signal BLC applied to a gate of the clamp transistor 21 becomes "H" state. The signal BLC is set to a voltage VCLAMP+Vtn, so that the voltage of the bit line subject to read attains VCLAMP (=VUX), when the reference current IL flows in the clamp transistor 21 during the read operation.

Simultaneously, the signal SW_0, which is controlled for respective memory cell MC becomes "L" state, thereby turning on the PMOS transistors 22d and 22e. This causes the reference current IL to begin to flow in the bit line BL. Now, the clamp transistor 21 is applied with a gate voltage (the voltage BLC) that causes the voltage value of the signal line DSA to attain exactly the voltage VCLAMP (=VUX), when a cell current Icell of the same current value as the reference current IL flows in the selected memory cell MC.

Moreover, the signal EQn becomes "L" state, which causes the equalize transistor 26 to be turned on. The sense node NSEN and the reference voltage drive circuit 181 become connected, whereby the voltages of the two input terminals of the differential amplifier 23 become equal. Now, the reference voltage drive circuit 181 bear a load large enough to maintain the potential of wirings that extend via the signal lines DSA to the bit lines BL at the reference voltage VREF_SA. Accordingly, the reference voltage drive circuit 181 needs to have a sufficient charge/discharge ability.

In addition, the signal PRECHGn becomes "L" state, while the signal PRECHGns is maintained at "H" state. The PMOS transistor 22f is turned off, and not used in precharge of the bit line BL. Now, the signal PRECHGna becomes "L" in tandem with the signal PRECHGn. The signal PRECHGna and the signal SW_0 become "L" state, whereby the voltage VCLAMP (=VUX) is supplied directly to the signal line DSA via the PMOS transistors 27a and 27b.

Subsequent to time T2, a cell current Icell according with the state of the selected memory cell MC flows, whereby the selected word line WL is charged. The voltage of the selected bit line BL is determined such that it is in an equilibrium state where a balance between the current flowing into the bit line BL from sense amplifier 20 and the current flowing out to the word line WL is accomplished. A load current Idrv_all of the reference voltage drive circuit 181 is a total of cell current Icell subtracted from reference current IL for each of the sense amplifiers 20. The reference voltage drive circuit 181 ensures that a voltage drop due to this load current Idrv_all and wiring resistance does not cause the voltage VREF_SA applied to each of the sense amplifiers 20 to deviate largely from a certain voltage value.

At time T3, the signal EQn becomes "H" state to complete precharge of the bit lines BL and sense node NSEN, and the read operation is started. A period tSEN from time T3 to time T4 is a period of the first sensing operation. If the cell current is large compared to the reference current IL (IL<Icell), the voltage of the sense node NSEN falls. Conversely, if the cell current Icell is small compared to the reference current IL (IL>Icell), the voltage of the sense node NSEN rises. The value of the determining current I_read used in data determination is I_read=Csen·(VCLAMP−VREF_SA)/tSEN+IL (where Csen is capacitance of the sense node NSEN). In the present embodiment, the voltage VCLAMP of the sense node NSEN and the reference voltage VREF_SA are set equal. Since voltage amplitude for determining data is small, it may be regarded that determining current Iread≈IL.

At time T4, when the signal STRBn becomes "L" state, the differential amplifier 23 compares the reference voltage VREF_SA with the sense node NSEN. A determination result of data is then loaded into the sense data latch 24 based on the output signal of the differential amplifier 23.

At time T5, if the voltage of the sense node NSEN connected to the selected memory cell MC is determined to befalling (Icell>IL(≈Iread)), the selected memory cell MC is assumed to be in the low-resistance state and is read as "0" data. In subsequent sensing operations, that selected memory cell MC is excluded from the memory cells MC subject to read. Therefore, the bit line discharge signal BLDIS is set to "H" state, based on the result of the sense data latch 24, the bit line discharge transistor 25 is thereby turned on, and the selected bit line BL(Icell_1) discharged. This results in the cell current Icell no longer flowing in the memory cell MC excluded from the memory cells MC subject to the read operation. The first sensing operation ends at time T5.

At time T6, the signal. EQn is reset to "L" state, thereby returning the voltage of the sense node NSEN to a state prior to the first sensing operation. The potential of the bit line BL is almost set at the bit line voltage VUX in sense amplifiers 20 connected to memory cells MC where read data is not established, i.e., memory cells where the bit line BL is not discharged. Moreover, the voltage of the sense node NSEN is at a higher level than the reference voltage VREF_SA. Consequently, in a precharge period from time T6, the voltage of the sense node NSEN, which has small capacitance, is simply returned to the reference voltage VREF_SA. Hence, the precharge is completed in a comparatively short time.

Thereafter, a period between time T6 and time T10, is a period of the second sensing operation, during which a similar operation to that from time T2 to time T6 is performed. Selected memory cells MC read as being in the low-resistance state in the second sensing operation are excluded from the memory cells MC subject to read. Therefore, the bit line discharge signal BLDIS is set to "H" state, based on the result of the sense data latch 24, the bit line discharge transistor 25 is thereby turned on, and the selected bit line BL(Icell_m) discharged. Furthermore, from time T10 to time T14 is a period of the third sensing operation, during which a similar operation to that from time T2 to time T6 is performed.

When the series of read operations is completed in the third sensing operation, at time T14, the signal BLSEL is set to "L" state, thereby discharging all of the bit lines BL. Then, at time T15, discharge of the unselected word lines WL is performed, and, at time T16, the main row decoder 50 and the column decoder 40 are disabled, thereby completing the operation.

When changing the selected bit lines BL and restarting a next series of read operations, there is no need to set the control signal MWLSEL of the main row decoder 50 to "L" state each time. In this case, the enable signal BLSWSEL of the column decoder 40 is set to "L" state, then the selected bit line addresses are changed. Then, the signal BLSWSEL is reset to "H" state allowing the read operation to be continued.

Advantages of Semiconductor Memory Device in First Embodiment

Advantages of the semiconductor memory device in the present embodiment are described with reference to a semiconductor memory device in comparative examples. A configuration of the semiconductor memory device in the comparative examples is assumed to be similar to the above-described configuration of the semiconductor memory device in accordance with the first embodiment.

Figure 6:
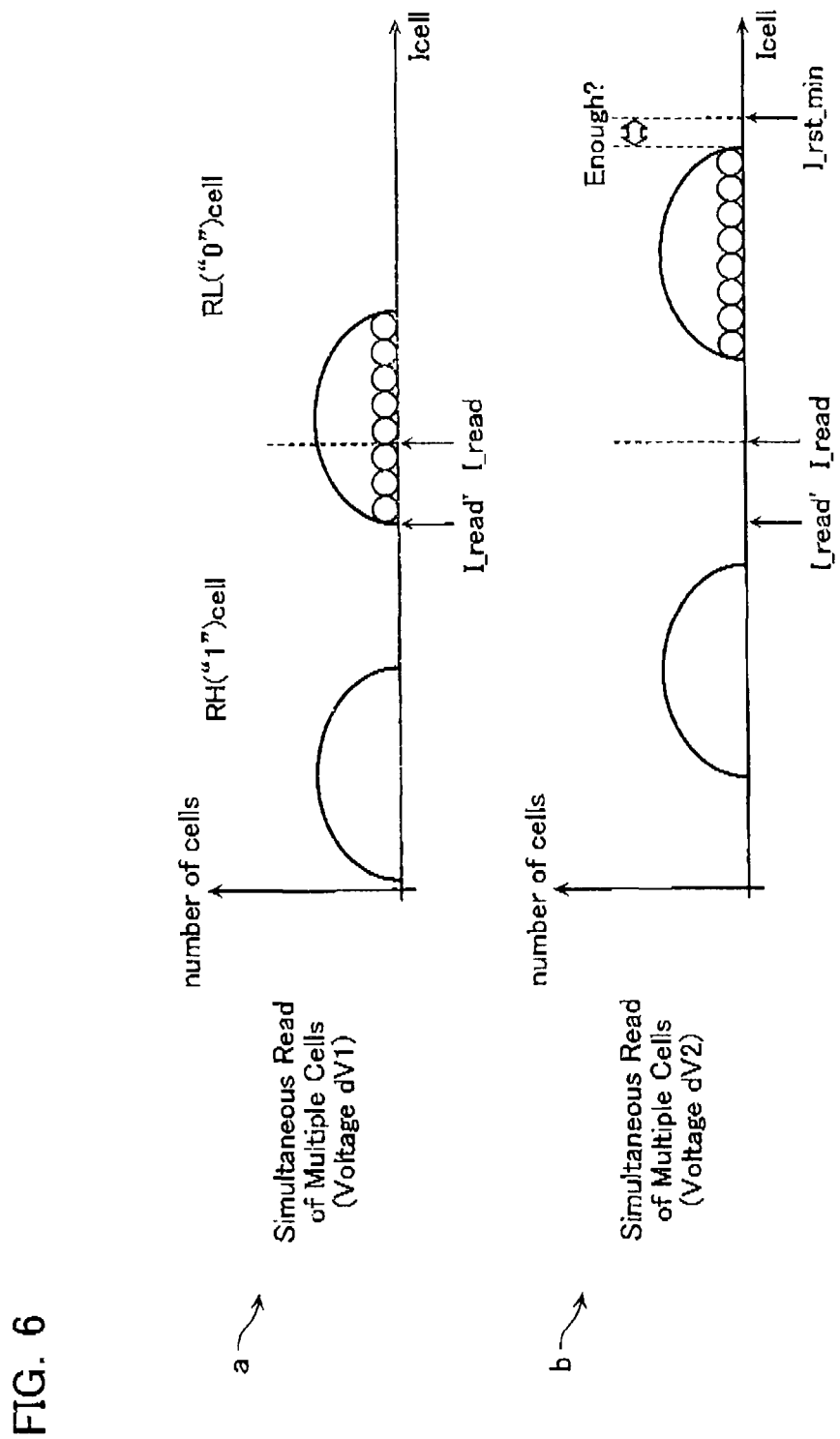
FIG. 6 is a view explaining a read operation in a semiconductor memory device in a comparative example.

Operation of Semiconductor Memory Device in Accordance with Comparative Examples FIG. 6 is a view explaining a read operation in a semiconductor memory device in a comparative example. The semiconductor memory device in the comparative example also reads data simultaneously from a plurality of memory cells MC in the memory cell array 10. However, the semiconductor memory device in the comparative example executes the read operation in only a single sensing operation.

When data is read simultaneously from the plurality (for example, 16) of memory cells MC, a cell current flows towards the single selected word line WL from each of the several of those 16 selected memory cells MC that are in the low-resistance state. If there are a large number of low-resistance state memory cells MC, the voltage of the selected word line WL rises higher than the voltage Vss_row, whereby the voltage between the selected bit lines BL and the selected word line WL becomes less than the desired value dV1.

Symbol "a" in FIG. 6 is a distribution showing a state when the read operation is executed simultaneously on the plurality of selected memory cells MC. If there are a large number of low-resistance state memory cells MC among the plurality of memory cells MC subject to the multiple-cell simultaneous read, the potential of the selected word line WL rises, whereby the voltage applied to the selected memory cells MC decreases to below the supposed value dV1. This leads to the risk that memory cells MC close to the lower limit in the distribution RL can only pass a cell current Icell which is below the determining current I_read and are thus provisionally determined to be in the high-resistance state (distribution RH), even if those memory cells MC are in the low-resistance state.

In order to prevent this kind of mis-determination, it is required to take the above-described rise in voltage of the selected word line WL into account, and, accordingly, set the voltage applied to the selected memory cells MC to be larger than the voltage dV1. A voltage dV2 (dV1<dV2) can be applied to the selected memory cells MC by adjusting the voltage VUX of the selected bit lines RL or the voltage Vss_row of the selected word line WL.

Symbol "b" in FIG. 6 is a distribution showing a state when the read operation is executed simultaneously on the plurality of selected memory cells MC applying the voltage dV2 to the plurality of selected memory cells MC. As shown by the distribution of symbol "b" in FIG. 6, even when there are a large number of low-resistance state memory cells MC among the plurality of memory cells MC subject to the multiple-cell simultaneous read, and accordingly the voltage of the selected word line WL rises, the voltage dV2 larger than the voltage dV1 may be applied to the memory cells MC to cause the cell current Icell of the low-resistance state memory cells MC to become not less than the determining current I_read. Data can be reliably read.

However, there must be a sufficient margin between an upper limit of the cell current Icell during read of the memory cells MC and a lower limit value I_rst_min of the resetting current, in order to prevent an erroneous resetting operation from occurring during the read operation. As shown by the distribution of symbol "b" in FIG. 6, when the voltage dV2 is applied, a sufficient margin cannot be ensured between the lower limit value I_rst_min of the resetting current and the vicinity of the upper limit of the cell current Icell distribution. In this way, there is a possibility that, if the read operation is completed using only a single sensing operation, read-disturb cannot be reliably suppressed at the same time as accurately reading data from the memory cells MC.

Figure 7:
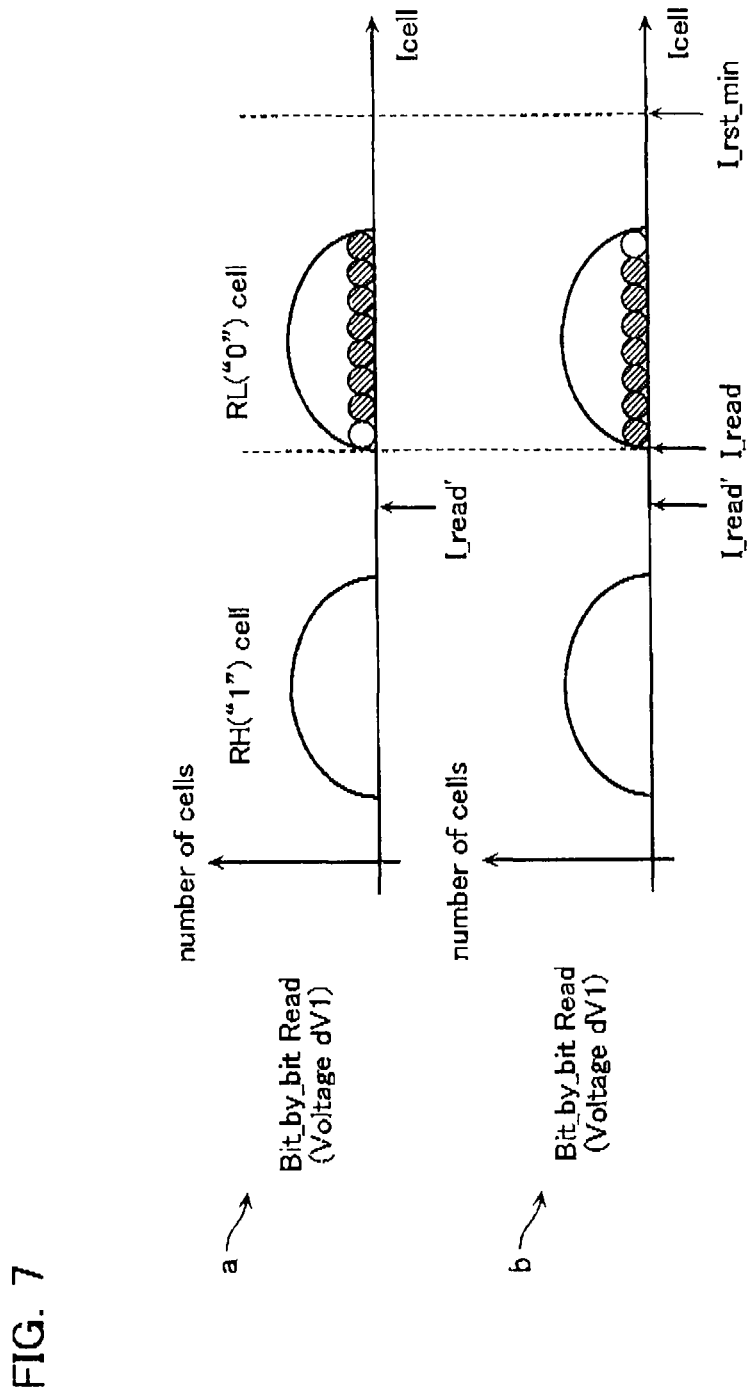
FIG. 7 is a view explaining the read operation in the semiconductor memory device in the comparative example.

FIG. 7 is a view explaining a read operation in a semiconductor memory device in another comparative example. The semiconductor memory device in the other comparative example performs the read operation by a bit-by-bit method in which data is read one-by-one basis from one memory cell MC in the memory cell array 10.

In the case of the bit-by-bit method where data is read from one selected memory cell MC, a single selected bit line BL in the memory cell array 10 is applied with the selected bit line voltage VUX. Moreover, the single selected word line WL is applied with the selected word line voltage Vss_row. The other unselected bit lines BL and unselected word lines WL are applied with, respectively, the unselected bit line voltage VUB and the unselected word line voltage VUX. When the memory cell MC is read one-by-one, a current does not flow in the other memory cells MC. As a result, only the cell current Icell flowing in the single selected memory cell MC flows into the selected word line WL, and the voltage of the selected word line WL changes only by the voltage drop due to the cell current in the selected memory cell MC itself, thereby causing no problems.

FIG. 7 is a distribution showing a state when the read operation is performed by the bit-by-bit method applying the voltage dV1 to the memory cell MC. As shown in FIG. 7, a distribution of low-resistance state memory cells MC which pass a cell current of the determining current I_read or more (RL("0") cell), and a distribution of high-resistance state memory cells MC which pass a cell current below the determining current I_read (RH("1") cell) are illustrated. In the bit-by-bit method, effects of the other memory cells MC need not be considered, hence data can be read precisely from the selected memory cell MC. The determining current I_read is determined from the lower limit value of the distribution of the low-resistance state memory cells MC when this bit-by-bit method is used. If that lower limit value itself is adopted as the determining current I_read, it becomes a determining value allowing read only by the bit-by-bit method. Hence, the determining current I_read is determined after being adjusted enough to allow simultaneous read of several memory cells MC, for example.

Symbol "a" in FIG. 7 shows the case where the cell current Icell of the read low-resistance state memory cell MC is close to the lower limit of the distribution. Symbol "b" in FIG. 7 shows the case where the cell current Icell of the read low-resistance state memory cell MC is close to the upper limit of the distribution. In the case of the bit-by-bit method, a certain margin can be obtained between the lower limit value I_rst_min of the resetting current and the upper limit of the distribution of the cell current Icell of the low-resistance state memory cells MC. Moreover, data can also be read accurately from the low-resistance state memory cell MC. However, in the bit-by-bit method, read speed of data is slow, since data is read one-by-one from the memory cell MC in the memory cell array 10.

In contrast, the semiconductor memory device in the present embodiment simultaneously reads data retained in a plurality of memory cells MC. Even when many of the selected memory cells MC as objects of the simultaneous sensing operation in the first sensing operation are in the high-resistance state in the present embodiment, increase in the upper limit of the distribution (refer to symbol "a" in FIG. 3) is quite small as compared to the upper limit of the distribution when reading by the bit-by-bit method (refer to symbol "a" in FIG. 7). That is, in the present embodiment, there is no need to set read voltage application conditions under which 16 bits have to be read simultaneously. It is sufficient to set voltage application conditions allowing a few bits to be read simultaneously. Therefore, significant increase in the cell current flowing in the memory cells MC can be suppressed, and risk of erroneous resetting during read can be reduced.

In addition, when the sensing operation is repeated multiple times, memory cells MC determined to be in the low-resistance state are excluded from the memory cells MC subject to a sensing operation in the next sensing operation. As the sensing operation is repeated in this way, the number of selected memory cells MC decreases, hence the current flowing into the selected word line WL decreases. Therefore, the potential rise in the selected word line WL due to the current flowing into the selected word line WL is gradually reduced. Memory cells MC in the low-resistance state but having a small value of cell current Icell are provisionally determined to be in the high-resistance state in the first sensing operation. However, in the second and later sensing operations, such memory cells MC are read in a state where the number of memory cells MC subject to simultaneous read is reduced and the potential rise of the selected word line WL is reduced. The distribution of cell current during these second and third sensing operations is close to the distribution when a single memory cell MC is applied with the voltage dV1 (FIG. 7), thereby allowing data to be read precisely from the selected memory cells MC. Therefore, there is no risk of low-resistance state (data "0") memory cells being erroneously read as high-resistance state (data "1") memory cells. The semiconductor memory device in the present embodiment allows data to be read reliably from selected memory cells while also reducing the risk of read-disturb.

Second Embodiment

Figure 8:
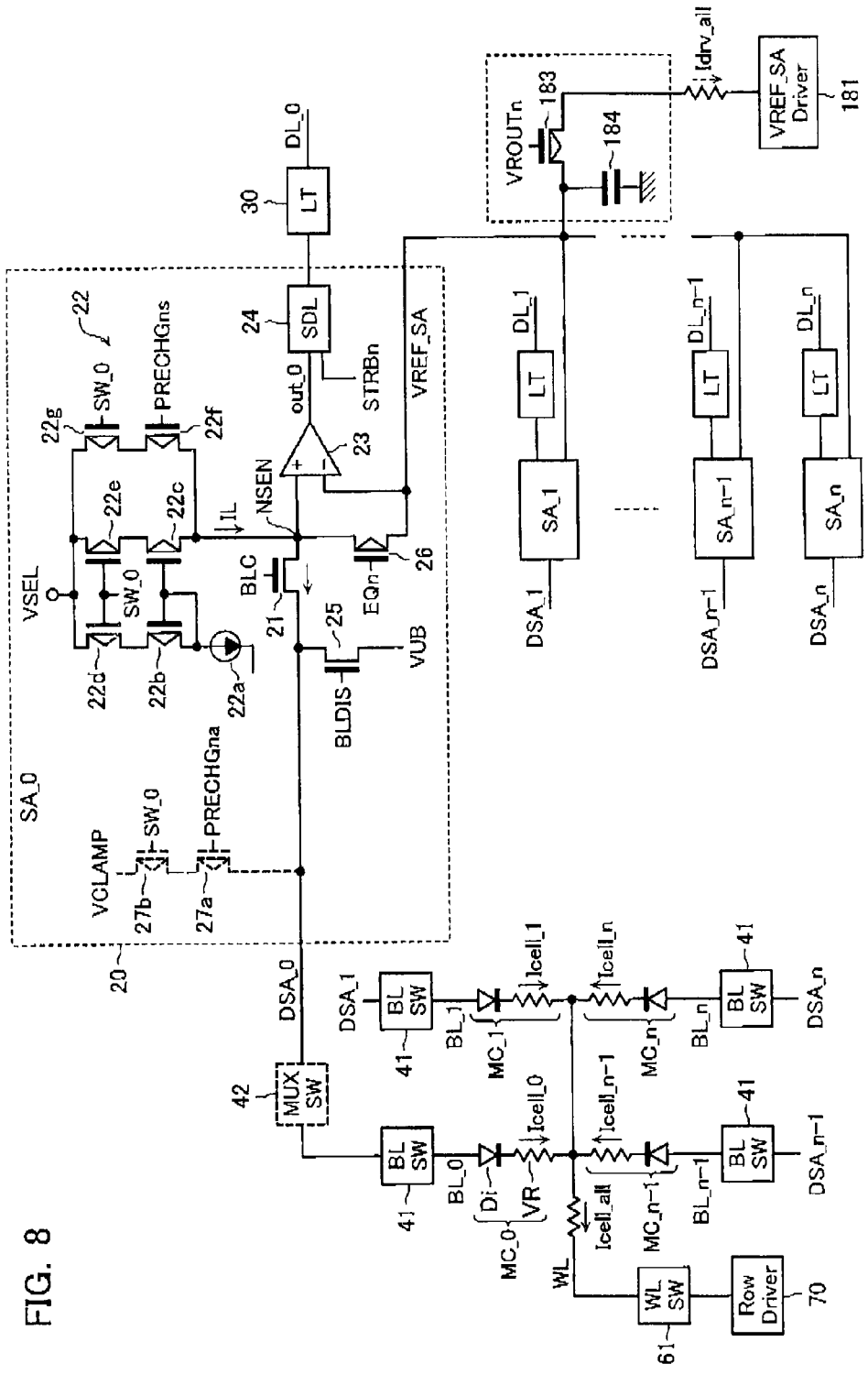
FIG. 8 is a circuit diagram explaining a control circuit in a semiconductor memory device in a second embodiment.

Configuration of Semiconductor Memory Device in Accordance with Second Embodiment Next, a control circuit and a read operation using the control circuit in a semiconductor memory device in a second embodiment of the present invention are described. FIG. 8 is a circuit diagram explaining the control circuit in the semiconductor memory device in the present embodiment. A configuration of the memory cell array 10, peripheral circuits, and so on, in the semiconductor memory device in the present embodiment is similar to those in the aforementioned semiconductor memory device in the first embodiment. Parts corresponding to those in the first embodiment are assigned with identical symbols to the first embodiment, and descriptions thereof are omitted.

As shown in FIG. 8, the control circuit in the semiconductor memory device in the present embodiment differs from the first embodiment in comprising a switch transistor 183 and a capacitor 184 between the reference voltage drive circuit 181 and the sense amplifiers 20. The switch transistor 183 is controlled by a signal VROUTn and, when turned off, is capable of setting to a floating state the inverting input terminal of the differential amplifier 23 applied with the reference voltage VREF_SA. In addition, the capacitor 184 maintains that voltage when the inverting input terminal is set to the floating state.

Operation of Semiconductor Memory Device in Accordance with Second Embodiment

Figure 9:
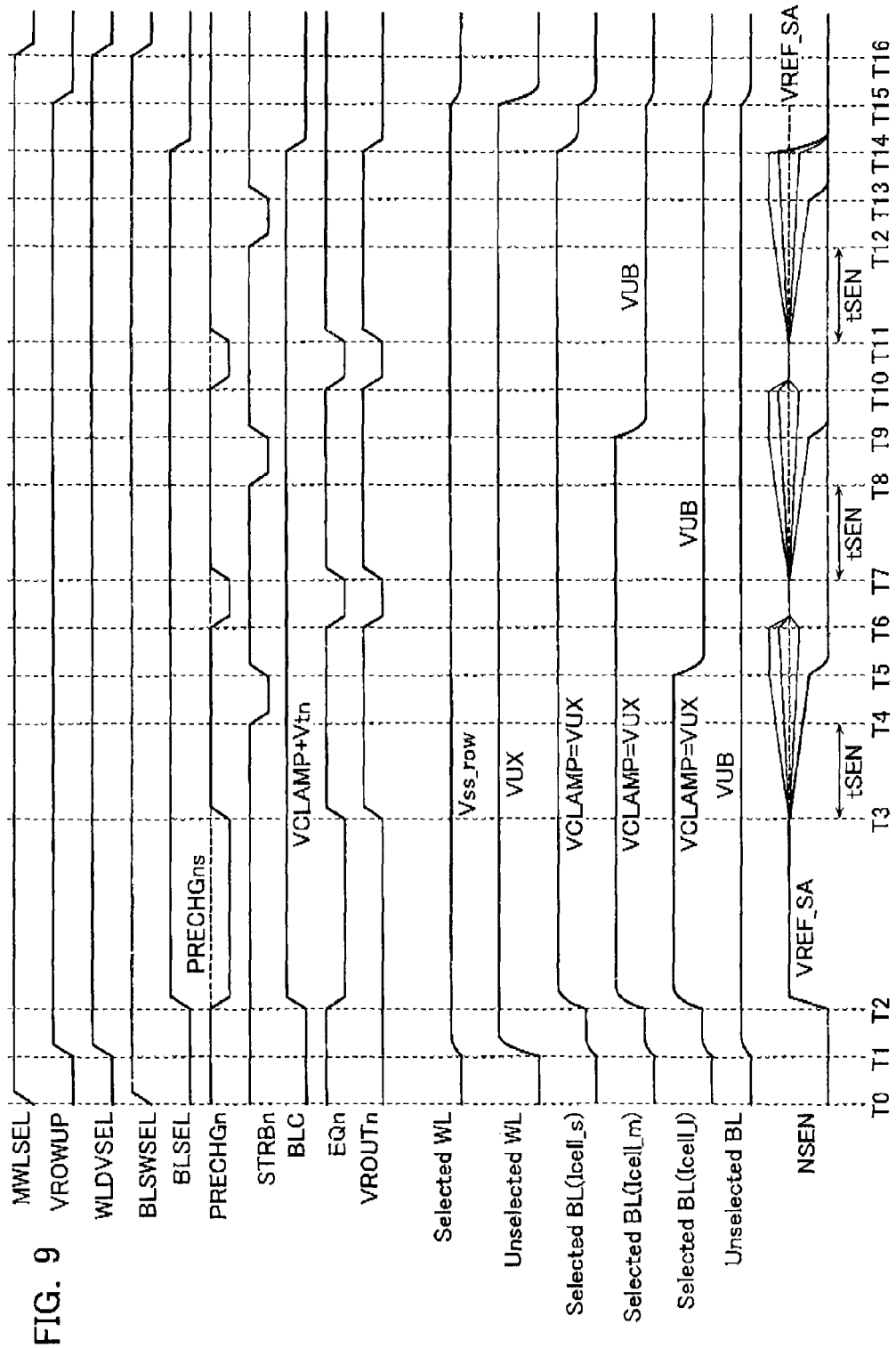
FIG. 9 is a timing chart explaining a read operation in the semiconductor memory device in the second embodiment.

The read operation employing the control circuit in the semiconductor memory device in the second embodiment is described with reference to FIG. 9. The timing chart of FIG. 9 shows states of typical control signals, and voltage values of the word lines WL, bit lines BL, and the sense node NSEN of the sense amplifier 20. The timing chart of FIG. 9 differs from that of FIG. 5 in including the signal VROUTn configured to control the switch transistor 183. Operation timing of the other signals, and voltage values of the word lines WL, bit lines BL, and so on, are similar to those in the first embodiment.

As shown in FIG. 9, the control signal VROUTn of the added switch transistor 183 is controlled in a substantially similar manner to the signal EQn. That is, in periods from time T2 to time T3, from time T6 to time T7, and from time T10 to time T11, the signal VROUTn is set to "L" state, matching where the signal EQn is set to "L" state. As a result, simultaneous with precharge of the bit line BL and the sense node NSEN by the reference voltage drive circuit 181 being completed, the signal EQn and the signal VROUTn become "H" state, whereby the switch transistor 183 and the equalize transistor 26 are turned off. The inverting input terminal of the differential amplifier 23 set to the floating state is maintained at the reference voltage VREF_SA by the capacitor 184. Then, in each of the periods from time T2 to time T6, from time T6 to time T10, and from time T10 to time T14, a corresponding one of the multiple time sensing operations is executed to perform the read operation, similarly to the first embodiment.

Advantages of Semiconductor Memory Device in Accordance with Second Embodiment

The semiconductor memory device in the present embodiment also repeats a sensing operation multiple times to determine data retained in memory cells MC. Memory cells MC determined to be in the low-resistance state each time the sensing operation is performed are excluded from the memory cells MC subject to a sensing operation in the next sensing operation. As the sensing operation is repeated in this way, the number of selected memory cells MC decreases, hence the current flowing into the selected word line WL decreases. This causes the potential rise in word line voltage to be suppressed, and allows data to be reliably read even from memory cells MC in the low-resistance state but having a small value of cell current Icell.

In the first embodiment, the load current Idrv_all of the reference voltage drive circuit 181 during the precharge operation is defined as the total of differences between the reference current IL and the cell current Icell for each of the sense amplifiers 20. There is thus a risk that, during the precharge operation, the value of the reference voltage VREF_SA of the reference voltage drive circuit 181 changes due to effects of the load current Idrv_all and parasitic resistance of lines. On the other hand, during the sensing operation, the reference voltage drive circuit 181 is not subject to a current load of the kind of the load current Idrv_all, and hence the reference voltage VREF_SA does not change. Consequently, in the control circuit in the first embodiment, it is necessary to be careful there are no effects due to a level difference in the reference voltage VREF_SA in the input terminals of the differential amplifier 23 during the precharge operation and during the sensing operation.

However, in the control circuit in the present embodiment, the inverting input terminal of the differential amplifier 23 applied with the reference voltage VREF_SA is set to the floating state during the sensing operation thereby maintaining that voltage. Even if the reference voltage VREF_SA changes during the precharge operation, that voltage during the precharge operation is maintained also during the sensing operation, hence equalizing precision can be improved.

Third Embodiment

Figure 10:
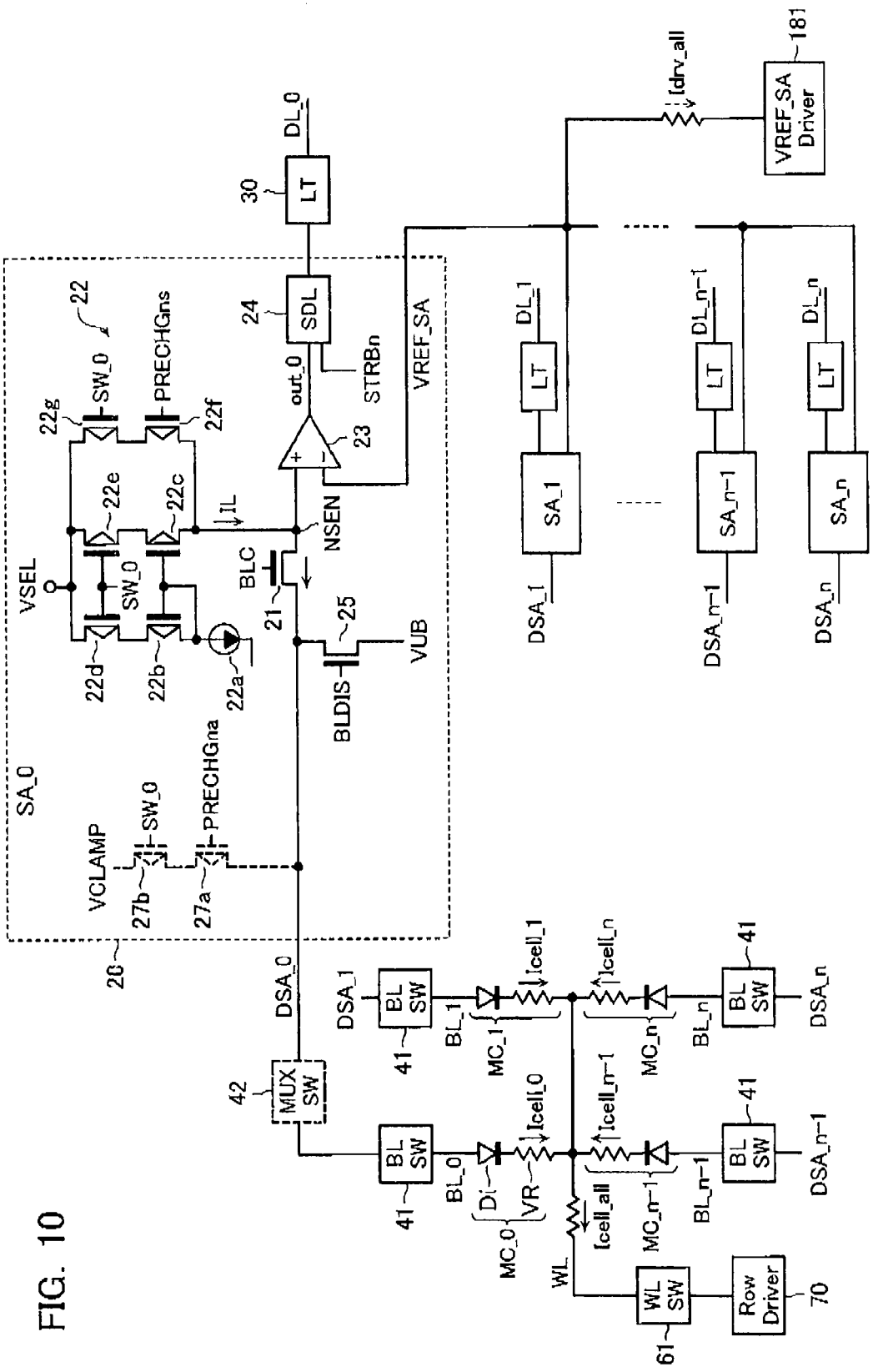
FIG. 10 is a circuit diagram explaining a control circuit in a semiconductor memory device in a third embodiment.

Configuration of Semiconductor Memory Device in Accordance with Third Embodiment Next, a control circuit and a read operation using the control circuit in a semiconductor memory device in a third embodiment of the present invention are described. FIG. 10 is a circuit diagram explaining the control circuit in the semiconductor memory device in the present embodiment. A configuration of the memory cell array 10, peripheral circuits, and so on, in the semiconductor memory device in the present embodiment is similar to those in the aforementioned semiconductor memory device in the first embodiment. Parts corresponding to those in the first embodiment are assigned with identical symbols to the first embodiment, and descriptions thereof are omitted.

As shown in FIG. 10, the control circuit in the semiconductor memory device in the present embodiment differs from the first and second embodiments in being configured without employing the equalize transistor 26, the switch transistor 183, and the capacitor 184. In the control circuit in the present embodiment, the voltage applied to the inverting input terminal of the differential amplifier 23 is constantly maintained at the reference voltage VREF_SA.

Figure 11:
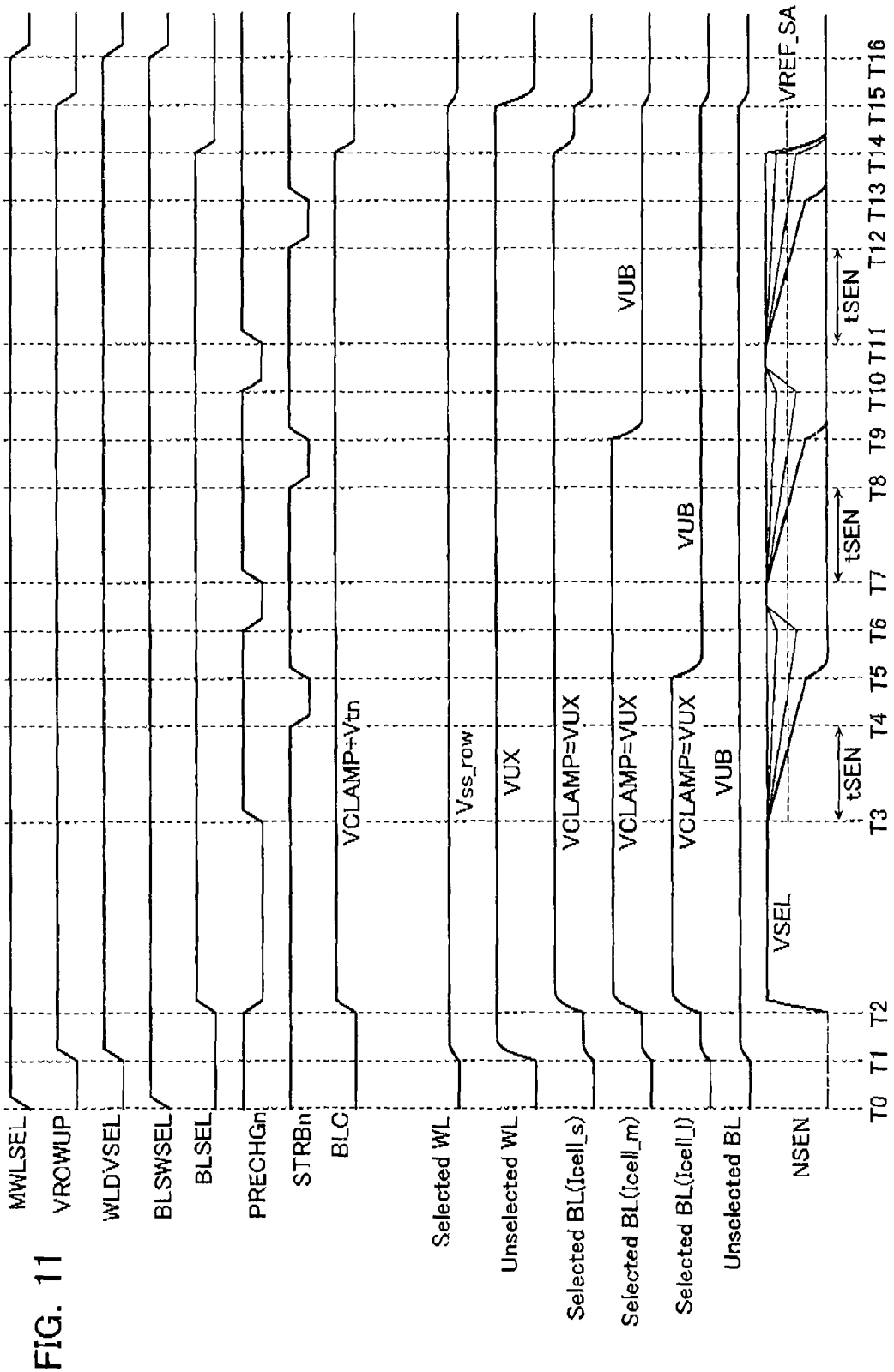
FIG. 11 is a timing chart explaining a read operation in the semiconductor memory device in the third embodiment.

Operation of Semiconductor Memory Device in Accordance with Third Embodiment The read operation employing the control circuit in the semiconductor memory device in the third embodiment is described with reference to FIG. 11. The timing chart of FIG. 11 shows states of typical control signals, and voltage values of the word lines WL, bit lines BL, and the sense node NSEN of the sense amplifier 20. The timing chart of FIG. 11 differs from those of FIGS. 5 and 9 in excluding the signal EQn configured to control the equalize transistor 26 and in excluding the signal VROUTn configured to control the switch transistor 183. The timing chart of FIG. 11 also differs from those of FIGS. 5 and 9 in having an identical waveform for the signal PRECHGns and the signal PRECHGn. Operation timing of the other signals is similar to that in the first and second embodiments. Moreover, voltage values of the word lines WL and bit lines BL are also similar to those in the first and second embodiments.

In the timing chart shown in FIG. 11, the precharge voltage of the sense node NSEN and the method of data determination differ from those in the first and second embodiments shown in FIGS. 5 and 9.

At time T2, the signal BLC becomes "H" state, whereby the clamp transistor 21 is turned on. Simultaneously, the reference current IL begins to flow into the bit line BL from the current mirror circuit 22. This causes the sense node NSEN to be precharged. In the first and second embodiments, the sense node NSEN is equalized with the inverting input terminal of the differential amplifier 23, hence the voltage only rises to the reference voltage VREF_SA. By contrast, in the present embodiment, the signal PRECHGns is set to "L" state during the bit line precharge period, thereby turning on the PMOS transistors 22g and 22f. As a result, the sense node NSEN of the sense amplifier 20 is charged to the voltage VSEL.

When the signal PRECHG becomes "H" state and precharge of the bit lines BL and the sense node NSEN is completed, the sensing operation starts. As mentioned above, the voltage of the sense node NSEN changes due to comparison between the reference current IL supplied by the current mirror circuit 22 and the cell current Icell. In the control circuit in the present embodiment, the data determination condition is defined by whether or not the sense node NSEN falls to the value of the reference voltage VREF_SA during a certain sensing time tSEN. The value of the determining current I_read employed in the data determination is I_read=Csen·(VSEL−VREF_SA)/tSEN+IL (where Csen is capacitance of the sense node NSEN). In the sensing operations in accordance with the first and second embodiments, the voltage amplitude for determining data is small, hence it may be regarded that the determining current Iread≈IL. By contrast, in the present embodiment, the difference between the voltage VSEL of the sense node NSEN and the reference voltage VREF_SA is large, resulting in the component of the first term in the expression for the determining current I_read being increased.

Consequently, a threshold of the cell current Icell with respect to the reference current IL differs from that in the first and second embodiments. However, in the present embodiment, data of the selected memory cell MC can be determined by using the differential amplifier 23 to detect whether the sense node NSEN oscillates as far as the value of the reference voltage VREF_SA. Likewise in the present embodiment, in each of the periods from time T2 to time T6, from time T6 to time T10, and from time T10 to time T14, a corresponding one of the multiple time sensing operations is executed to perform the read operation, similarly to the first and second embodiments.

Advantages of Semiconductor Memory Device in Accordance with Third Embodiment The semiconductor memory device in the present embodiment also repeats a sensing operation multiple times to determine data retained in memory cells MC. Memory cells MC determined to be in the low-resistance state each time the sensing operation is performed are excluded from the memory cells MC subject to a sensing operation in the next sensing operation. As the sensing operation is repeated in this way, the number of selected memory cells MC decreases, hence the current flowing into the selected word line WL decreases. This causes the potential rise in word line voltage to be suppressed, and allows data to be reliably read even from memory cells MC in the low-resistance state but having a small value of cell current Icell.

Fourth Embodiment

Operation of Semiconductor Memory Device in Accordance with Fourth Embodiment

Figure 12:
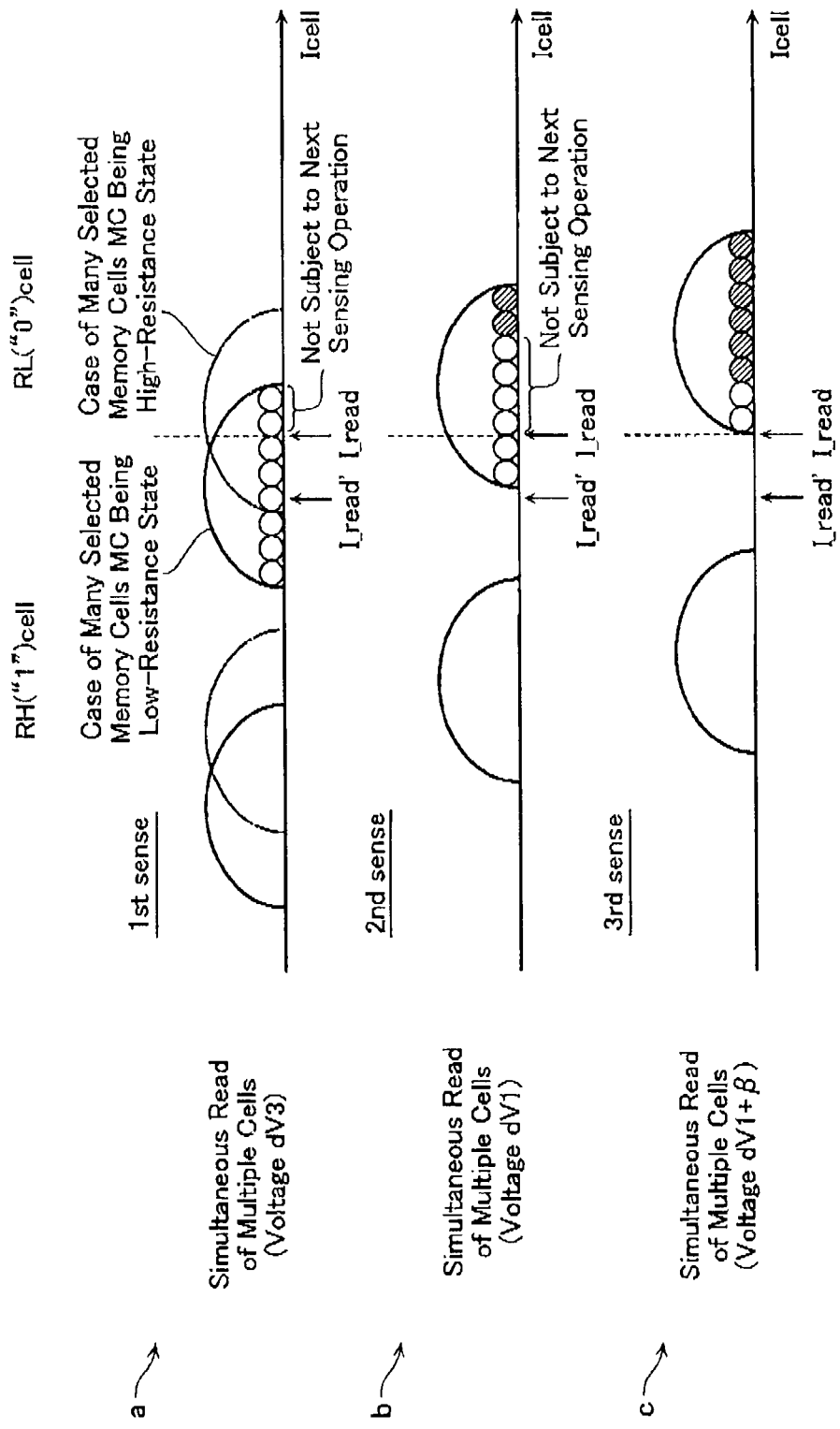
FIG. 12 is a view explaining a read operation in a semiconductor memory device in a fourth embodiment.

A configuration of the memory cell array 10, peripheral circuits, and so on, in the semiconductor memory device in the present embodiment is similar to that in the semiconductor memory devices in the aforementioned embodiments. A read operation in the semiconductor memory device in the present embodiment is described below with reference to FIG. 12. FIG. 12 is a view explaining the read operation in the semiconductor memory device in the present embodiment. Likewise in the read operation in the semiconductor memory device in the present embodiment, data is read simultaneously from a plurality of memory cells MC in the memory cell array 10.

The semiconductor memory device in the present embodiment differs from those in previous embodiments in the following point. Namely, in the read operation in the semiconductor memory device in the present embodiment, when the sensing operation is repeated two or more times to detect data retained in the memory cells MC, the voltage applied to the selected memory cells MC is changed. This read operation is described in detail below with reference to FIG. 12.

Symbol "a" in FIG. 12 is a distribution showing a state of the first of the multiply-repeated sensing operations. The selected bit line voltage VUX is set such that a voltage dV3 is applied to the selected memory cells MC during this sensing operation. A value of the voltage dV3 applied to the memory cells MC is smaller than the voltage dV1 applied in the aforementioned embodiments. In the aforementioned embodiments, the selected bit line voltage and the selected word line voltage when the voltage dV1 is applied to the selected memory cells MC are assumed to be, for example, 2 V and 0.5 V, respectively. On the other hand, the selected bit line voltage and the selected word line voltage when the voltage dV3 is applied to the selected memory cells MC can be set to, for example, 2 V and 0.7 V, respectively.

In the first sensing operation, the voltage dV3 is smaller than the voltage dV1, hence there are more memory cells MC having a cell current Icell falling below the determining current I_read than in the first embodiment shown at symbol "a" in FIG. 3. Therefore, the distribution shown at symbol "a" in FIG. 12 is shifted overall to the left side compared to the distribution shown at symbol "a" in FIG. 3. In the first sensing operation, even in the case that many of the selected memory cells MC are in the high-resistance state such that current does not flow into the selected word line WL and the voltage of the selected word line WL does not rise, there are some memory cells MC in which the cell current Icell does fall below the determining current I_read (refer to the distribution shown by the dashed-dotted line at symbol "a" in FIG. 12).

Now, the voltage dV3 must be set such that the cell current Icell does not fall below the determining current I_read for any of the selected memory cells MC. For example, if many of the selected memory cells MC are in the low-resistance state and there are no memory cells MC in which the cell current Icell is the determining current I_read or more, there will be no memory cells to be excluded from the memory cells subject to a sensing operation in the next sensing operation. Therefore, the voltage dV3 is set such that the cell current Icell of memory cells MC in the distribution that have a large cell current Icell will be the determining current I_read or more. Memory cells MC determined to be in the low-resistance state in this first sensing operation are excluded from the memory cells MC subject to a sensing operation in the next sensing operation.

Symbol "b" in FIG. 12 is a distribution showing a state of the second of the multiply-repeated sensing operations. The voltage applied to the selected memory cells MC during the second sensing operation is changed to the same voltage dV1 as in the previously-described embodiments. Likewise in the sensing operations in the present embodiment, the number of selected memory cells MC is reduced in the second sensing operation, hence the potential rise in the selected word line WL is suppressed compared to the first sensing operation. In addition, the voltage dV1 in the second sensing operation is larger than the voltage dV3 in the first sensing operation. Consequently, the voltage applied to the remaining selected memory cells MC subject to the second sensing operation is increased.

Several of the low-resistance state memory cells MC provisionally determined to be in the high-resistance state in the first sensing operation have their cell current Icell become the determining current I_read or more in the second sensing operation, and thus may be accurately determined to be in the low-resistance state. These low-resistance state memory cells MC are determined by the sense amplifiers. Memory cells MC determined to be in the low-resistance state in the second sensing operation are excluded from the memory cells MC subject to a sensing operation in the next sensing operation.

Symbol "c" in FIG. 12 is a distribution showing a state of the third of the multiply-repeated sensing operations. The voltage applied during the third sensing operation is set to dV1+β(≧dV1). The voltage dV1+β may have the same value as the voltage dV1 (β=0), or may have a different value to the voltage dV1. In the third sensing operation, memory cells MC determined to be in the low-resistance state in the first and second sensing operations have their bit lines BL discharged and are not applied with a voltage (shown by shaded circles in FIG. 12). As a result, the current flowing into the selected word line WL via the memory cells MC is reduced. The potential rise in the selected word line WL is suppressed compared to the second sensing operation, hence the voltage applied to the remaining selected memory cells MC subject to the third sensing operation is increased.

Consequently, the low-resistance state memory cells MC provisionally determined to be in the high-resistance state in the second sensing operation have their cell current Icell become the determining current I_read or more in the third sensing operation, and thus may be accurately determined to be in the low-resistance state. These low-resistance state memory cells MC are determined by the sense amplifiers.

In this manner, the semiconductor memory device in the present embodiment repeats the sensing operation multiple times to determine data retained in the memory cells MC. Further, each time the sensing operation is performed, the voltage applied to the selected memory cells MC is given a different value. The voltage dV3 applied to the selected memory cells MC during the first sensing operation has a value smaller than that of the voltage dV1. Hence, the upper limit of the cell current Icell during read of the memory cells MC never exceeds the lower limit value I_rst_min of the resetting current. As a result, data can be read accurately without occurrence of read-disturb, even from memory cells MC where a large cell current Icell flows.

Figure 13:
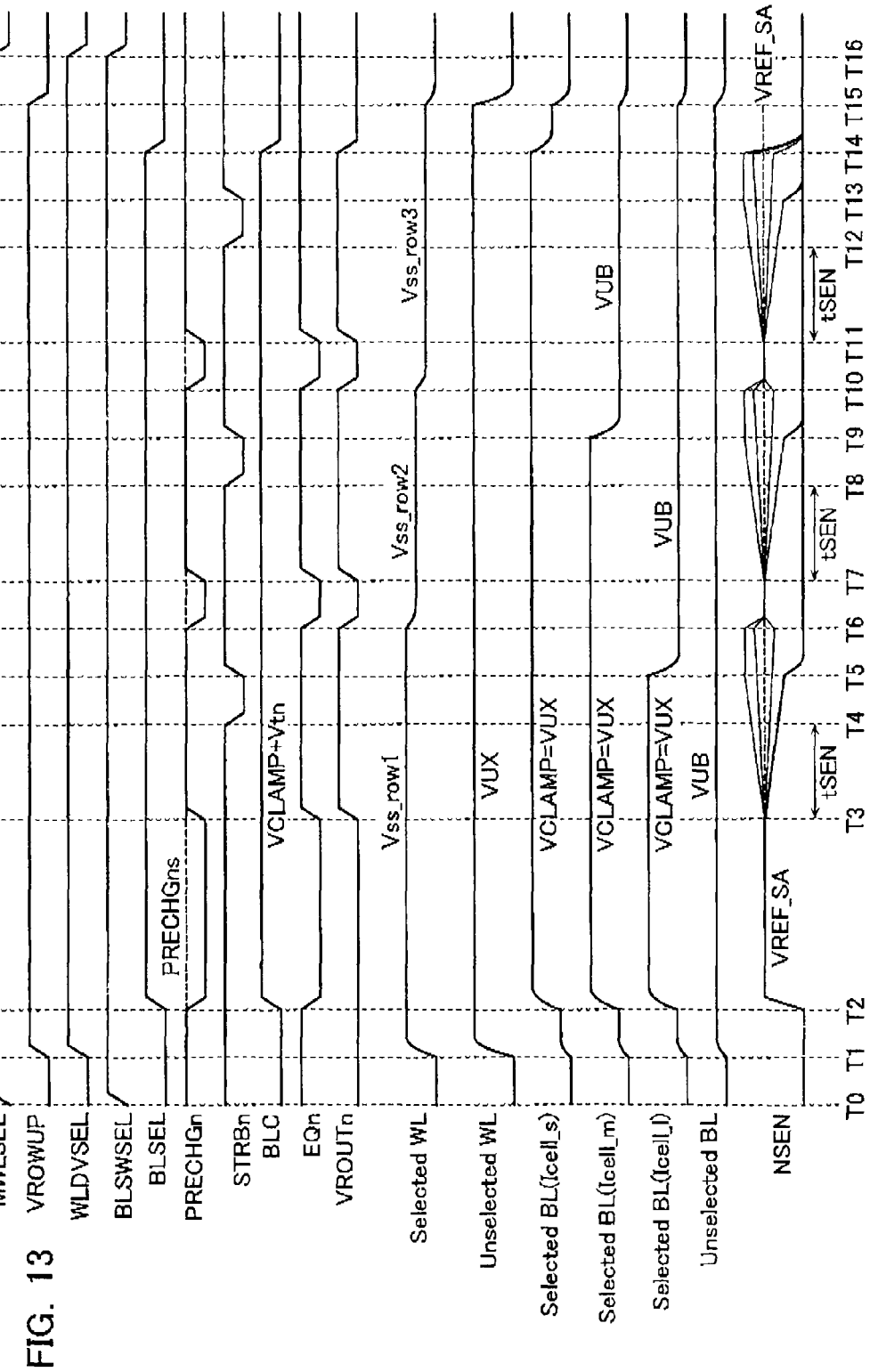
FIG. 13 is a timing chart explaining the read operation in the semiconductor memory device in the fourth embodiment.
Figure 14:
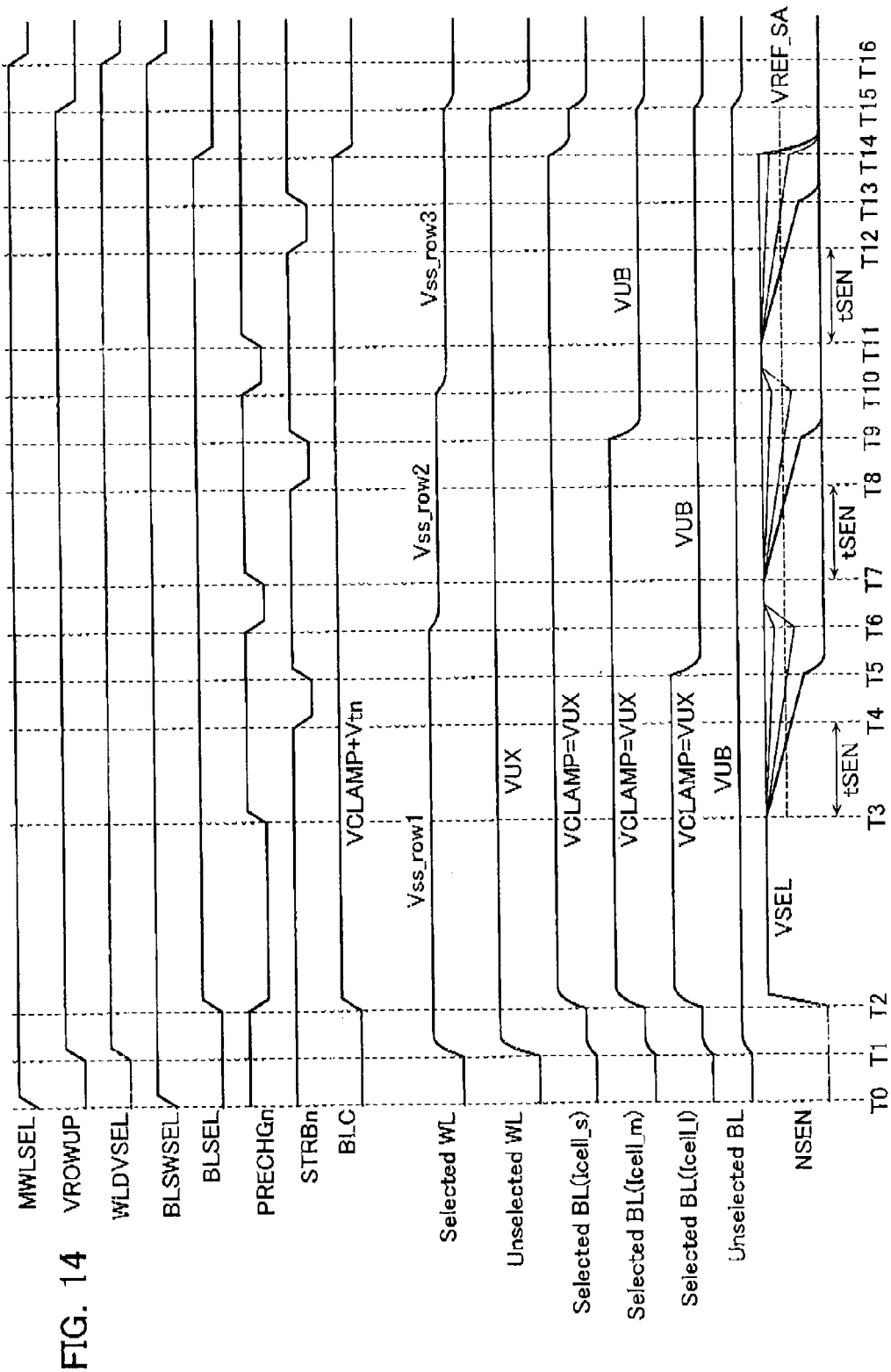
FIG. 14 is a timing chart explaining the read operation in the semiconductor memory device in the fourth embodiment.

Next, operation timing in the control circuit configured to enable such operation is described with reference to FIGS. 13 and 14. FIGS. 13 and 14 are timing charts explaining the read operation. The control circuit employed in the fourth embodiment may be any of the control circuit in the first embodiment shown in FIG. 4, the control circuit in the second embodiment shown in FIG. 8, or the control circuit in the third embodiment shown in FIG. 10. FIG. 13 is a timing chart when employing the control circuit in the first and second embodiments, and FIG. 14 is a timing chart when employing the control circuit in the third embodiment. Operation timing of signals, and voltage values of the bit lines BL, the sense node NSEN, and so on, shown in FIGS. 13 and 14 are similar to those in the corresponding embodiments.

The timing charts shown in FIGS. 13 and 14 differ from the previously-described embodiments in having the voltage Vss_row applied to the selected word line WL changing each time the sensing operation is performed. The voltage of the selected word line WL is a voltage Vss_row1 during the first sensing operation, a voltage Vss_row2 during the second sensing operation, and a voltage Vss_row3 during the third sensing operation. In the read operation in the present embodiment, the voltage applied to the selected word line WL from the word line drive circuit 70 each time the sensing operation is performed changes. This allows the voltage applied to the selected memory cells MC to be set to a different value each time the sensing operation is performed. Likewise in the present embodiment, in each of the periods from time T2 to time T6, from time T6 to time T10, and from time T10 to time T14, a corresponding one of the multiple time sensing operations is executed to perform the read operation, similarly to the previously-described embodiments.

Advantages of Semiconductor Memory Device in Accordance with Fourth Embodiment

The semiconductor memory device in the present embodiment also repeats a sensing operation multiple times to determine data retained in memory cells MC. Memory cells MC determined to be in the low-resistance state each time the sensing operation is performed are excluded from the memory cells MC subject to a sensing operation in the next sensing operation. As the sensing operation is repeated in this way, the number of selected memory cells MC decreases, hence the current flowing into the selected word line WL decreases. This causes the potential rise in word line voltage to be suppressed, and allows data to be reliably read even from memory cells MC in the low-resistance state but having a small value of cell current Icell.

In addition, when repeating the sensing operation multiple times, the semiconductor memory device in the present embodiment sets the voltage applied to the selected memory cells MC to different values. Adjusting to an optimal value the voltage applied to the selected memory cells MC each time the sensing operation in performed allows data to be read reliably even from memory cells MC where a large cell current Icell flows. In particular, during the first sensing operation, by applying the voltage dV3 lower than the voltage dV1 to the memory cells MC, erroneous resetting operation due to the cell current Icell exceeding the lower limit value I_rst_min of the resetting current can be prevented.

[Others]

Figure 15A:
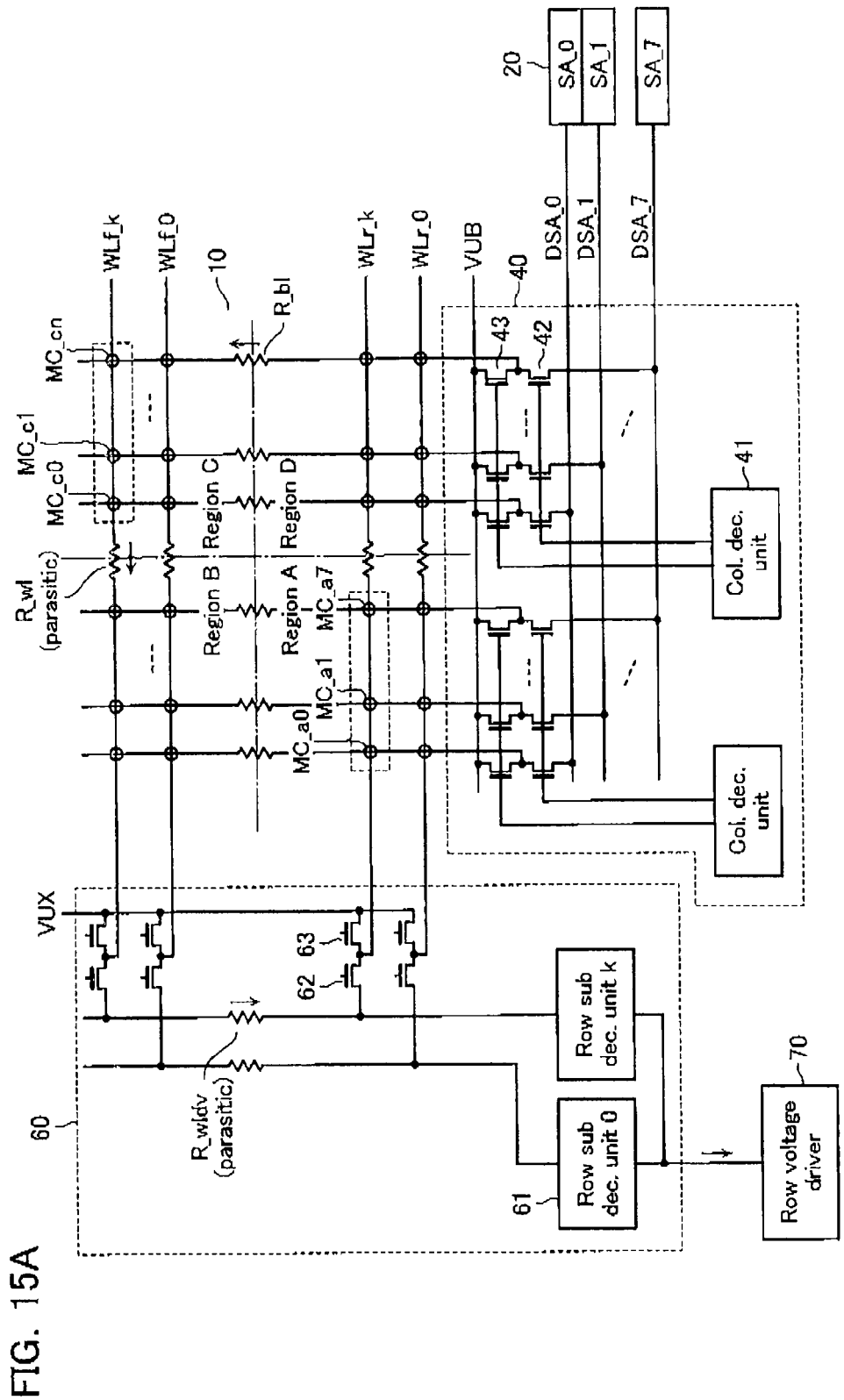
FIG. 15A is a view showing a control circuit in a semiconductor memory device in a comparative example.

FIG. 15A is a view showing a control circuit in a semiconductor memory device in another example.

In the previously-described embodiments, no consideration is given to where the plurality of selected memory cells MC subject to the simultaneous read operation are in the memory cell array 10. However, the value of the parasitic resistance up to the word line drive circuit 70 differs between when the selected memory cells MC are close to the word line drive circuit 70 and when the selected memory cells MC are distant from the selected memory cells MC.

For example, the memory cell array 10 is divided into four regions, namely regions A, B, C, and D. The memory cells MC in each of the regions A-D are selected by the column decoder 40 and the sub row decoder 60, and are connected to certain sense amplifiers 20 and the word line drive circuit 70. Selection of the memory cells MC is performed by a column decoder unit 41 (aforementioned bit line switch 41) and select transistors 42 and 43, and by a sub row decoder unit (aforementioned word line switch 61) and select transistors 62 and 63. When a memory cell MC in region A is selected, a parasitic resistance R_bl of the bit line BL, a parasitic resistance R_wl of the word line WL, and, moreover, a parasitic resistance R_wldv in the sub row decoder 60, in a path from the word line drive circuit 70 to the sense amplifiers 20 via the memory cell MC, are small. Conversely, when a memory cell MC in region C is selected, all of the above-described parasitic resistances become large.

Figure 15B:
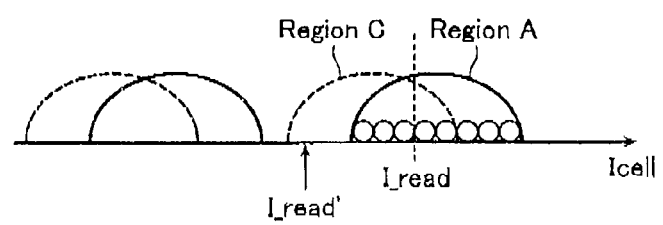
FIG. 15B is a view explaining a read operation in the semiconductor memory device in the comparative example.

FIG. 15B is a distribution showing a state when the read operation is executed simultaneously on a plurality of memory cells MC (during the first sensing operation in the read method in the aforementioned embodiments). If the distributions of cell current in the memory cells MC in region A and cell current in the memory cells MC in region C are displayed separately, the distribution of cell current in region C is displaced in a direction of decreased current compared to the cell current distribution in region A. This is because, as previously mentioned, there is a large parasitic resistance in the current path of the memory cells MC in region C, leading to a large voltage drop effect. Moreover, in the cell current distribution in region A, simultaneously selecting a plurality of memory cells causes the cell current to be displaced to a certain extent in the direction of decreased current compared with the cell current distribution when using the aforementioned bit-by-bit method. The determining current I_read in FIG. 15B is assumed to be similar to the determining current in the read method shown in the aforementioned embodiments.

In the read method in the aforementioned embodiments, when it comes to the second sensing operation and the third sensing operation, the number of memory cells MC that are simultaneously selected and pass a large cell current decreases, hence the effects of voltage drop are gradually reduced. Therefore, the difference between the cell current in region A and the cell current in region C is gradually reduced. Hence, the read operation in the aforementioned embodiments functions even when the respective regions are selected. However, a difference intrinsically arises in the cell current between region A and region C in the bit-by-bit method, hence it is difficult to optimize the read operation to also adjust and absorb this difference in the cell current, simply by the aforementioned consecutive sensing operations. In other words, a large difference in conditions between region A and region C is not desirable when promoting optimization of more desirable applied voltages and number of sensing times.

Figure 16B:
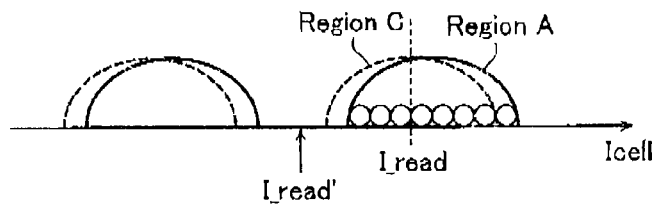
FIG. 16B is a view explaining a read operation in the other example of a semiconductor memory device.
Figure 16A:
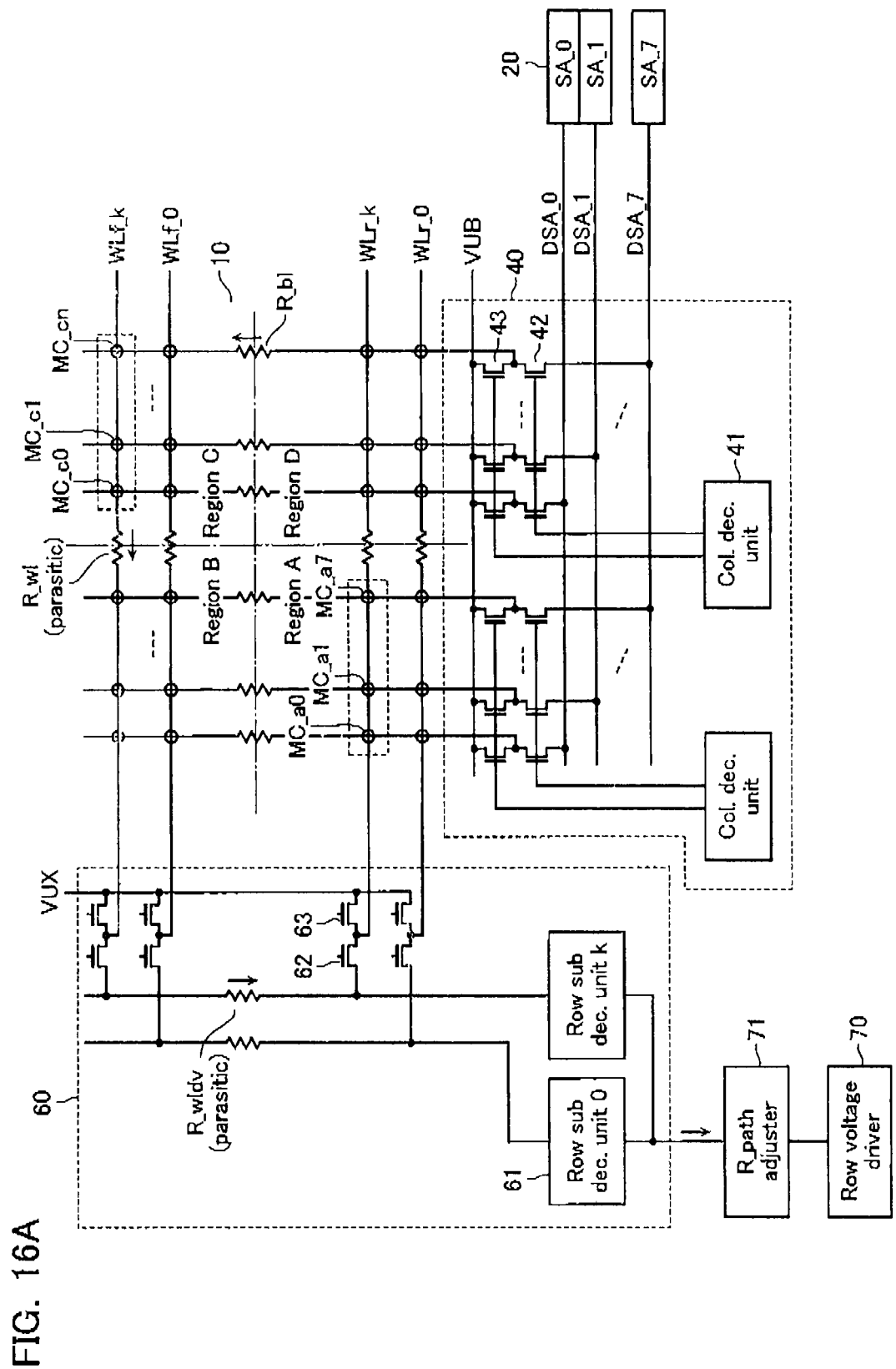
FIG. 16A is a view showing a control circuit in another example of a semiconductor memory device.
Figure 17:
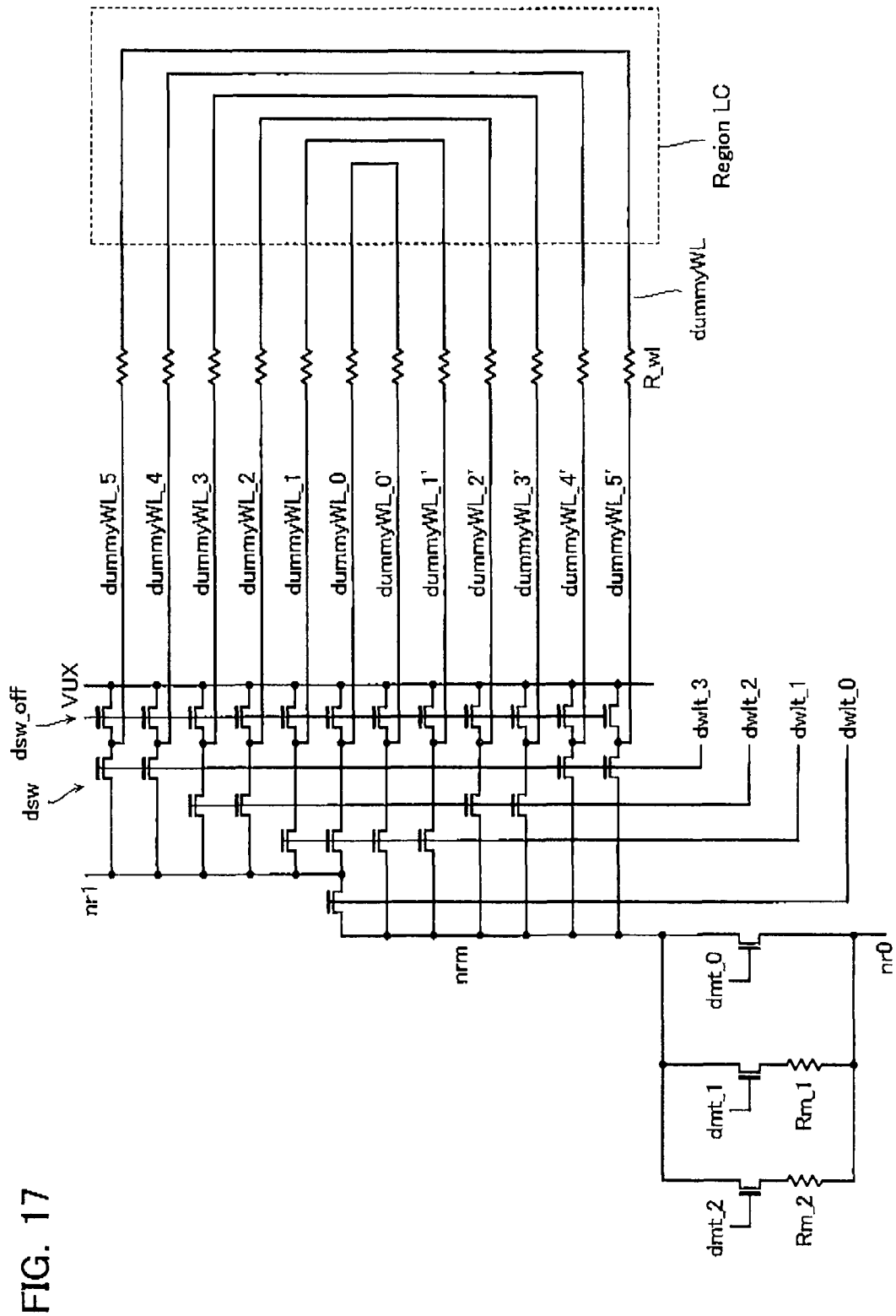
FIG. 17 is a circuit diagram explaining a configuration of a resistance adjusting circuit.

Accordingly, as shown in FIG. 16A, a resistance adjusting circuit 71, configured having its resistance value changeable, is connected between the word line drive circuit 70 and the memory cell array 10. FIG. 17 is a circuit diagram showing a configuration example of the resistance adjusting circuit 71.

The resistance adjusting circuit 71 requires a function for adjusting the parasitic resistance (R_wl, R_bl) of wiring material of the word lines WL (and including also the bit lines BL), and a function for adjusting a resistance R_wldv in the sub row decoder 60 which is wiring material other than that of the bit lines BL and word lines WL. In the example shown in FIG. 17, between a node nr1 and a node nrm, there is a resistance adjusting circuit employing dummy word lines dummyWL, and between the node nrm and a node nr0, there is a circuit configured to adjust a wiring resistance of other than the word lines WL and bit lines BL. In the resistance adjusting circuit employing the dummy word lines dummyWL, word lines WL employing a partly different structure to that of ordinary word lines WL are used to reference the resistance of the wiring material of the word lines WL.

Consider, for example, the dummy word line dummyWL0. The dummy word line dummyWL0 is connected from the node nrm to the wiring layer of the word line WL via a dummy word line switch dsw. The dummy word line dummyWL0 then doubles back in region LC and returns once again to the dummy word line switch dsw, as dummy word line dummyWL0', to be connected to node nr1. For example, in the process for forming the word lines WL and bit lines BL using a side wall processing process, there is usually a cut region such as region LC. In the dummy word line portion of this resistance adjusting circuit 71, the region LC is left uncut, thereby enabling dummy word lines of doubled-back shape to be easily formed.

When the word lines WL are doubled back in this way, and when the sheet resistance is the same, the resistance is doubled by the dummy word lines making a round trip. Therefore, by parallelizing using a plurality of dummy word lines and using control signals dwlt_0-dwlt_3 to enable adjustment of the number of parallelized dummy word lines, a desired dummy resistance can be inserted in the current path of the cell current.

In addition, in the resistance adjusting circuit between the node nr0 and the node nrm, a resistance adjusting path including a plurality of different resistances (Rm_1, Rm_2) can be selected by control signals dmt0-2.

Enabling adjustment of the resistance (R_wl, R_bl) of the word line WL (and including also the bit line BL) portion in the memory cell array 10 and enabling adjustment of the resistance (R_wldv) of a portion other than this portion in the memory cell array 10 in the above-described way makes it possible to adjust the resistance of memory cells MC having a parasitic resistance component that differs according to the position of the selected memory cells MC in the memory cell array 10.

For example, if a memory cell MC in region C is selected, the resistance of the word line WL and the parasitic resistance within the sub row decoder 60 both increase. In this case, the resistance adjusting circuit shown in FIG. 17 performs an operation selecting the signals dwlt_0 and dmt_0 to prevent the resistance increasing any further.

If a memory cell MC in region B is selected, the resistance of the word line WL is comparatively reduced, hence, for example, the signals dwlt_1 and dwlt_2, and the signal dmt_0 are selected. As a result, the dummy word line resistance adjusted by the signals dwlt_1 and dwlt_2 is added, whereby the resistance of the current path of the memory cell MC in region B approaches the resistance of the aforementioned current path in region C.

If a memory cell MC in region A is selected, then, for example, the signals dwlt_1 and dwlt_2, and the signal dmt_1 are selected, since region A is a region where the resistance of the current path is smallest. In this case, not only is the resistance due to the dummy word line added, but also the resistance Rm_1 to adjust the parasitic resistance of other non-word line wiring is added, whereby the resistance of the current path of the memory cell MC in region C is approached.

The dummy word line switch dsw_off in FIG. 17 is used when the unselected word line voltage VUX is applied without using the resistance adjusting circuit of the dummy word lines dummyWL. The dummy word line switch dsw_off is turned off, and the node nrm and node nr1 are directly connected by the signal dwit_0.

When the read operation is executed, an approximate value of the parasitic resistance from the selected memory cell MC to the word line drive circuit 70 can be known based on the address of the selected memory cell MC. Setting the resistance value of the resistance adjusting circuit 71 to an optimum value such that values of this parasitic resistance are aligned enables voltage application conditions when memory cells MC in each region are selected to be aligned. As a result, as shown in FIG. 16B, when a bias application is performed during the read operation, the difference in cell current distribution of memory cells MC between region A and region C can be reduced. FIG. 16B is a representation of the cell current distribution during an initial sensing operation in the read operation of the aforementioned embodiments. The cell current distribution is under the determining current I_read, but continuing to perform the sensing operation a second and third time by the aforementioned method makes it possible to complete read under the determining current I_read. By thus performing the read operation in conjunction with an adjustment for position dependency of the cell current in the selected memory cells MC using the resistance adjusting circuit 71, data can be read more accurately.

Note that this dummy word line dummyWL can be provided along with an ordinary word line WL in an ordinary memory cell array 10. In this case, the memory cell MC formed at an intersection of the dummy word line dummyWL and the bit line BL must be a memory cell MC that is not executed a forming operation. If the dummy word line dummyWL is provided in the memory cell array 10, when a certain memory cell MC is selected, a dummy word line in the same memory cell array 10 can be used as the dummy word line dummyWL. In addition, when a certain memory cell MC is selected, a dummy word line dummyWL disposed in another unselected memory cell array 10 may be used.

Even if the memory cell MC formed in the dummy word line dummyWL is a memory cell MC that is not executed the forming operation and is in an unselected memory cell array 10, it is desirable that that memory cell MC is applied with only an extremely weak bias. In addition, a configuration may be adopted in which the memory cell MC or diode Di are not formed at the intersection of the dummy word line dummyWL and the bit line BL. In that case, although the processing step becomes rather complex, the above-described limitations are removed, whereby resistance adjustment becomes more easily controllable.

This concludes description of embodiments of the present invention, but it should be noted that the present invention is not limited to the above-described embodiments, and that various alterations, additions, and so on, are possible within a range not departing from the scope and spirit of the invention. For example, in the embodiments, the read operation in a resistive memory device was described. However, the embodiments may also be applied to a verify operation for verifying whether a selected memory cell MC transitions to a desired resistance state subsequent to the setting operation or resetting operation. For example, in the case of a setting verify operation for verifying if a memory cell MC transitions to the low-resistance state, it is not always the case that all the memory cells MC transition to the low-resistance state. In this case, although it cannot be determined that the memory cell MC is in the low-resistance state even on performing the sensing operation a certain number of times, a result signifying 'verify fail' can be obtained. Based on this verify result, a setting operation is reliably executed on the 'verify fail' memory cell MC in the next setting pulse application operation.

In addition, in the embodiments, the sensing operation is described as being repeated three times. However, the number of times the sensing operation is repeated is not limited to three. The number of times the sensing operation is repeated can be selected as desired based on the time required for the read operation, the precision of the write operation, and so on.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array having memory cells disposed at intersections of a plurality of first lines and a plurality of second lines respectively, each of the memory cells including a variable resistor; and
a control circuit configured to execute a read operation by applying a certain voltage to selected one of the memory cells disposed at the intersection of selected one of the first lines and selected one of the second lines and detecting a current flowing in the selected one of the first lines, thereby determining a resistance state of the variable resistor in the selected one of the memory cells,
the read operation being an operation configured to execute a sensing operation multiple times and aggregate determination results thereof, the sensing operation being configured such that a first voltage is applied to a plurality of selected ones of the first lines and a second voltage lower than the first voltage is applied to a single selected one of the second lines,
the control circuit being configured to suspend application of the first voltage to the first line connected to the selected one of the memory cells determined to be in a first resistance state in one of the sensing operations, and execute the next sensing operation,
the control circuit further comprising a first resistance adjusting circuit including a dummy word line, the first resistance adjusting circuit being configured to set a resistance value that differs depending on a position of the selected one of the memory cells in the memory cell array, and
the control circuit applying the second voltage to the selected one of the second lines via the first resistance adjusting circuit.

2. The semiconductor memory device according to claim 1, wherein the control circuit further comprises a second resistance adjusting circuit configured to set a plurality of different resistance values, and
wherein the control circuit applies the second voltage to the selected one of the second lines via the first resistance adjusting circuit and the second resistance adjusting circuit.

3. The semiconductor memory device according to claim 1, wherein the control circuit includes:
a transistor having a source terminal connected to one of the first lines; and
a differential amplifier configured to determine a resistance state of the selected one of the memory cells by comparing a voltage of a drain terminal of the transistor and a reference voltage, and
wherein a gate terminal of the transistor is controlled such that, when a reference current flows between the drain terminal and source terminal of the transistor, the first voltage is applied to the one of the first lines.

4. The semiconductor memory device according to claim 3, further comprising a reference voltage drive circuit configured to supply the reference voltage to an input terminal of the differential amplifier.

5. The semiconductor memory device according to claim 4, further comprising:
an equalize transistor connected between the drain terminal of the transistor and the input terminal of the differential amplifier,
wherein the equalize transistor is turned on prior to each of the sensing operations being started and sets a voltage of the drain terminal of the transistor equal to the reference voltage.

6. The semiconductor memory device according to claim 5, further comprising:
a switch transistor and a capacitor connected between the reference voltage drive circuit and the input terminal of the differential amplifier,
wherein the switch transistor, when turned off, renders the input terminal of the differential amplifier in a floating state, and
wherein the capacitor, when the input terminal of the differential amplifier is in the floating state, maintains a voltage of the input terminal of the differential amplifier.

7. The semiconductor memory device according to claim 3, further comprising a current circuit configured to allow the reference current to flow to the drain terminal of the transistor during the read operation.

8. A semiconductor memory device, comprising:
a memory cell array having memory cells disposed at intersections of a plurality of first lines and a plurality of second lines respectively, each of the memory cells including a variable resistor; and
a control circuit configured to execute a read operation by applying a certain voltage to selected one of the memory cells disposed at the intersection of selected one of the first lines and selected one of the second lines and detecting a current flowing in the selected one of the first lines, thereby determining a resistance state of the variable resistor in the selected one of the memory cells,
the read operation being an operation configured to execute a sensing operation multiple times and aggregate determination results thereof, the sensing operation being configured such that a first voltage is applied to a plurality of selected ones of the first lines and a second voltage lower than the first voltage is applied to a single selected one of the second lines,
the control circuit being configured to suspend application of the first voltage to the first line connected to the selected one of the memory cells determined to be in a first resistance state in one of the sensing operations, and execute the next sensing operation setting a voltage applied to the selected one of the memory cells not determined to be in the first resistance state in a precedent sensing operations to a value not less than that applied during the precedent sensing operations, the control circuit further comprising a first resistance adjusting circuit including a dummy word line, the first resistance adjusting circuit being configured to set a resistance value that differs depending on a position of the selected one of the memory cells in the memory cell array, and the control circuit applying the second voltage to the selected one of the second lines via the first resistance adjusting circuit.

9. The semiconductor memory device according to claim 8, wherein the control circuit changes a voltage applied to the selected one of the memory cells by changing the second voltage.

10. The semiconductor memory device according to claim 8, wherein the control circuit further comprises a second resistance adjusting circuit configured to set a plurality of different resistance values, and wherein the control circuit applies the second voltage to the selected one of the second lines via the first resistance adjusting circuit and the second resistance adjusting circuit.

11. The semiconductor memory device according to claim 8, wherein the control circuit includes:

a transistor having a source terminal connected to one of the first lines; and a differential amplifier configured to determine a resistance state of the selected one of the memory cells by comparing a voltage of a drain terminal of the transistor and a reference voltage, and wherein a gate terminal of the transistor is controlled such that, when a reference current flows between the drain terminal and source terminal of the transistor, the first voltage is applied to the one of the first lines.

12. The semiconductor memory device according to claim 11, further comprising a reference voltage drive circuit configured to supply the reference voltage to an input terminal of the differential amplifier.

13. The semiconductor memory device according to claim 12, further comprising:

an equalize transistor connected between the drain terminal of the transistor and the input terminal of the differential amplifier, wherein the equalize transistor is turned on prior to each of the sensing operations being started and sets a voltage of the drain terminal of the transistor equal to the reference voltage.

14. The semiconductor memory device according to claim 13, further comprising:

a switch transistor and a capacitor connected between the reference voltage drive circuit and the input terminal of the differential amplifier, wherein the switch transistor, when turned off, renders the input terminal of the differential amplifier in a floating state, and wherein the capacitor, when the input terminal of the differential amplifier is in the floating state, maintains a voltage of the input terminal of the differential amplifier.

15. The semiconductor memory device according to claim 11, further comprising a current circuit configured to allow the reference current to flow to the drain terminal of the transistor during the read operation.

16. An operation method of a semiconductor memory device, the semiconductor device including: a memory cell array having memory cells disposed at intersections of a plurality of first lines and a plurality of second lines respectively, each of the memory cells including a variable resistor; and a control circuit configured to execute a read operation by applying a certain voltage to selected one of the memory cells disposed at the intersection of selected one of the first lines and selected one of the second lines and detecting a current flowing in the selected one of the first lines, thereby determining a resistance state of the variable resistor in the selected one of the memory cells, the method comprising:

executing a sensing operation by the control circuit, the sensing operation being configured such that a first voltage is applied to a plurality of selected ones of the first lines and a second voltage lower than the first voltage is applied to a single selected one of the second lines;

suspending application of the first voltage to the first line connected to the selected one of the memory cells determined to be in a first resistance state in one of the sensing operations, and executing the next sensing operation;

executing the read operation by executing the sensing operation multiple times and aggregating determination results thereof; and applying the second voltage to the selected one of the second lines via a resistance adjusting circuit, the resistance adjusting circuit being configured to set a resistance value that differs depending on a position of the selected one of the memory cells in the memory cell array.

17. The operation method of a semiconductor memory device according to claim 16, further comprising:

determining a resistance state of the selected one of the memory cells by comparing a voltage of a drain terminal of a transistor and a reference voltage, the transistor having a source terminal connected to one of the first lines.

18. The operation method of a semiconductor memory device according to claim 17, further comprising:

controlling a gate terminal of the transistor such that the first voltage is applied to the one of the first lines.

* * * * *